(12) United States Patent
Hsieh et al.

(10) Patent No.: US 8,093,119 B2
(45) Date of Patent: Jan. 10, 2012

(54) CMOS MICROELECTROMECHANICAL SYSTEM (MEMS) DEVICE AND FABRICATION METHOD THEREOF

(75) Inventors: Tsung-Min Hsieh, Taipei County (TW); Chien-Hsing Lee, Hsinchu County (TW)

(73) Assignee: Solid State System Co., Ltd., Hsinchu (TW)

( * ) Notice: Subject to any disclaimer, the term of this patent is extended or adjusted under 35 U.S.C. 154(b) by 125 days.

(21) Appl. No.: 12/490,318

(22) Filed: Jun. 24, 2009

(65) Prior Publication Data

US 2010/0330722 A1    Dec. 30, 2010

(51) Int. Cl.
*H01L 21/8238* (2006.01)

(52) U.S. Cl. ... 438/199; 438/706; 438/733; 257/E21.17; 257/E21.006; 257/E21.051; 257/E21.223; 257/E21.229; 257/E21.267; 257/E21.304; 257/E21.632

(58) Field of Classification Search ............ 438/199, 438/197, 706, 733, 618, 692, 787, 786; 257/E21.17, 257/6, 51, 223, 267, 304, 632, 229

See application file for complete search history.

(56) References Cited

U.S. PATENT DOCUMENTS

| 6,391,788 | B1 * | 5/2002 | Khan et al. | 438/714 |
|---|---|---|---|---|
| 6,759,340 | B2 * | 7/2004 | Nallan et al. | 438/714 |
| 6,830,221 | B1 * | 12/2004 | Janson et al. | 244/158.1 |
| 7,321,457 | B2 * | 1/2008 | Heald | 359/291 |
| 7,372,115 | B2 * | 5/2008 | Baney | 257/419 |

OTHER PUBLICATIONS

C. Gormley et al., "State of the Art Deep Silicon Anisotropic Etching on SOI Bonded Substrates for Dielectric Isolation and MEMS Applications," Fifth International Symposium on Semiconductor Wafer Bonding: Science, Technology and Applications. The Fall Meeting of the Electrochemical Society, Hawaii, USA, Oct. 17-22, 1999.

* cited by examiner

*Primary Examiner* — David Nhu
(74) *Attorney, Agent, or Firm* — Jianq Chyun IP Office

(57) ABSTRACT

A method for fabricating the MEMS device includes providing a substrate. Then, a structural dielectric layer is formed over the substrate at a first side, wherein a diaphragm is embedded in the structural dielectric layer. The substrate is patterned from a second side to form a cavity in corresponding to the diaphragm and a plurality of venting holes in the substrate. An isotropic etching process is performed from the first side and the second side of the substrate via vent holes to remove a dielectric portion of the structural dielectric layer for exposing a central portion of the diaphragm while an end portion is held by a residue portion of the structural dielectric layer.

18 Claims, 31 Drawing Sheets

CMOS MICROELECTROMECHANICAL SYSTEM (MEMS) DEVICE AND FABRICATION METHOD THEREOF

BACKGROUND OF THE INVENTION

1. Field of Invention

The present invention relates to CMOS microelectromechanical system (MEMS) device and the fabrication method. More particularly, the present invention relates to CMOS microelectromechanical system (MEMS) device with reduced damaged during etching process.

2. Description of Related Art

The CMOS MEMS device usually includes the CMOS circuit and the MEMS device, which are fabricated at the same substrate by semiconductor fabrication process. For the MEMS device with a sensing diaphragm, such as the microphone diaphragm or other application, a long etching process may be included for etching most of material including dielectric and silicon substrate. Since the device is under a long time of etching process, the MEMS structure may be damaged.

FIG. 1 is a cross-sectional view, schematically illustrating a conventional MEMS device at the stage to etch the substrate. As the issues noted by the present invention, in FIG. 1, after the structural dielectric layer 62 has been formed on the substrate 60, the substrate 60 needs to be etched to form a cavity and venting holes 64. However, since the depth of venting holes 64 are usually large and need a long etching time, an undercut usually occurs at the interface between the silicon oxide and the silicon substrate 60. The region 66 is expanded as shown at lower drawing. The undercut 69 occurs at the edge of the venting hole 64 between substrate 60 and the oxide 68. This causes defects of the MEMS device.

Further, it usually takes a long time to etch the dielectric so as to expose the diaphragm, another issue has also been noted by the invention. FIG. 2 is a cross-sectional view, schematically illustrating the process to etch the dielectric of the MEMS device for exposing the diaphragm. In FIG. 2, the structural dielectric layer 72 has bee formed on the substrate 70. The substrate 70 has been etched from the backside to have cavity and venting holes 74 as described in FIG. 1, in which the undercut still exits but not involved into the later issue in FIG. 2 for etching the dielectric of the structural dielectric layer 72. In order to expose the diaphragm, the isotropic etching process is performed form the back side and the front side. The dielectric at front side is etched to expose the diaphragm. However, the dielectric material under the diaphragm is not etched fast because the etchant can only pass the venting holes 74 to etch the dielectric material and it usually takes a long etching time. The issue then occurs.

When the substrate 70 is immersed in the etchant solution, the etching time for dielectric layer on back side is much longer than that on front side. Especially, the etching rate decreases significantly for the dielectric layer in the narrow gap between diaphragm and silicon substrate. Moreover, the etching rate also slows down when the etchant has to pass through vent holes 74 and cavity. Therefore, when the dielectric layer in the gap is removed, the exposed portions 76 of the diaphragm may be damaged due to the long exposure on etchant solution. As can be seen, it needs longer time to remove the oxide dielectric between the diaphragm and the substrate 70. It causes the diaphragm on the exposed 76, where the metal layer is exposed first, to be attacked easily by the etchant. In addition, most metal layers, e.g. TiN, exposed to etchant is formed by the structure of pillar grain with the grain boundary perpendicular to the surface of a diaphragm. The etchant is easy to penetrate the metal layer along the grain boundary into the dielectric of a diaphragm and damage the diaphragm. This conventional issue considered by the present invention and the solution proposed by the present invention will be discussed later in FIGS. 21 and 22.

The invention has noted at least the foregoing issues. How to at least reduce the issues need to be developed.

SUMMARY OF THE INVENTION

The invention provides a MEMS device with CMOS circuit, in which the venting hole can be formed with reduced undercut and the damage to the diaphragm is also reduced.

The invention also provides a method for fabricating a MEMS device. The method for fabricating the MEMS device includes providing a substrate. Then, a structural dielectric layer is formed over the substrate at a first side, wherein a diaphragm is embedded in the structural dielectric layer. The substrate is patterned from a second side to form a cavity in corresponding to the diaphragm and a plurality of venting holes in the substrate. An isotropic etching process is performed from the first side and the second side of the substrate via vent holes to remove a dielectric portion of the structural dielectric layer for exposing a central portion of the diaphragm while an end portion is held by a residue portion of the structural dielectric layer.

The invention also provides a method for fabricating a MEMS device. The method for fabricating the MEMS device includes providing a substrate. Then, a structural dielectric layer is formed over the substrate at the first side, wherein a diaphragm and a plurality of dielectric blocks enclosed by conductive layers are embedded in the structural dielectric layer, wherein the dielectric blocks form a back plate, and a reserved dielectric portion is between the dielectric blocks. The substrate is patterned from a second side to form a cavity in corresponding to the diaphragm and to expose the structural dielectric layer and bottom conductive layers of the dielectric blocks within the cavity. A first-stage isotropic etching process is performed to etch at least a dielectric portion of the structural dielectric layer, wherein the reserved dielectric portion between the dielectric blocks is etched to form the venting holes, and the venting holes expose a conductive wall of dielectric blocks of the back plate. A second-stage isotropic etching process is performed from the first side and the second side of the substrate via the vent holes to remove a dielectric portion of the structural dielectric layer for exposing a central portion of the diaphragm and the back plate while an end portion of the diaphragm and an end portion of the back plate is held by a residue portion of the structural dielectric layer.

The invention also provides a method for fabricating a MEMS device. The method for fabricating the MEMS device includes providing a substrate, having a first side and second side. A structural dielectric layer is formed over the first side of the substrate. The structural dielectric layer comprises a mass bulk and at least one suspension beam coupled to the mass bulk, wherein the mass bulk comprises metal layers and a dielectric block covered by the metal layers. The substrate is patterned from the second side to form an isolated silicon bulk coupled to a mass bulk. An isotropic etching process is performed from the first side and the second side of the substrate to remove a dielectric portion of the structural dielectric layer for exposing the mass bulk while an end portion of suspension beams is held by a residue portion of the structural dielectric layer.

In a further embodiment, the step of providing the substrate comprises forming a metal silicide on the substrate at the first side, covering a MEMS region of the substrate, wherein the metal silicide is exposed in the step of patterning the substrate from the second side to form the isolated silicon bulk.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Several embodiments are provided for describing the invention but not for limiting the invention. Further, the embodiments can be properly combined to each other without limited to individual embodiments.

Figure 3:
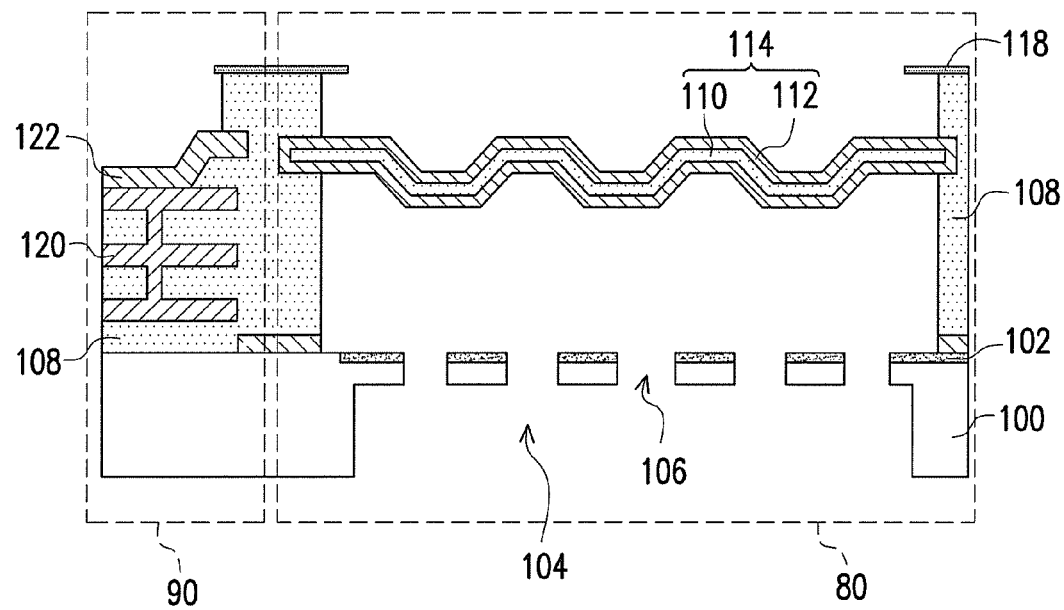
FIG. 3 is a cross-sectional view, schematically illustrating a MEMS device, according to an embodiment of the invention.

FIG. 3 is a cross-sectional view, schematically illustrating a MEMS device, according to an embodiment of the invention. In FIG. 3, the CMOS MEMS device includes the CMOS circuit 90 and MEMS device 80, which are fabricated over the same substrate 100. The CMOS circuit 90 is fabricated by usual semiconductor fabricating process to form the circuit 120 with the bonding pad 122, for example. The circuit 120 is embedded in the dielectric layer 108, and is also referred as the structural dielectric layer 108 in the invention. The circuit 120 is a part the whole CMOS circuit, in which just the interconnection is shown. The structural dielectric layer 108 includes some device structure or interconnecting having been embedded in the dielectric. The MEMS device 80 includes a diaphragm 114, which is preferably formed in a corrugated structure to produce the spring effect and absorb the device stress. In other words, the corrugated diaphragm is used as spring to release the residual stress of composite metal/oxide/metal laminar layers. The diaphragm 114 can include, for example, the outer conductive layer 112 enclosing the dielectric layer 110. The end portion of the diaphragm 114 is held by the structural dielectric layer 108. The diaphragm 114 can sense pressure different or acoustical signal, for example, in accordance with the actual design in various applications.

Figure 1:
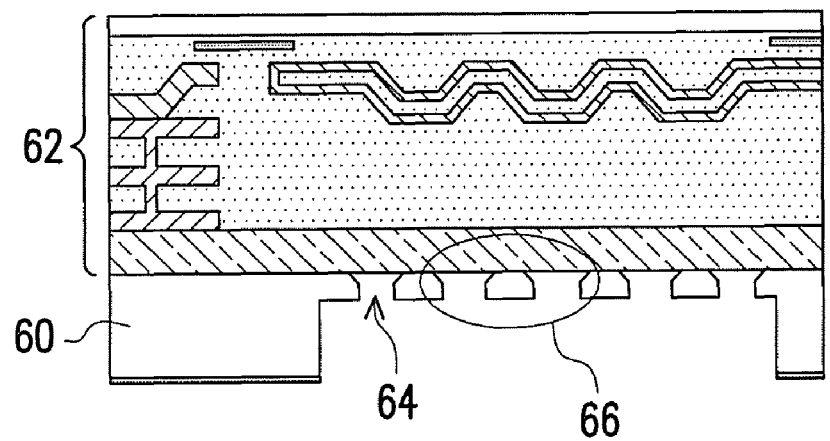
FIG. 1 is a cross-sectional view, schematically illustrating a conventional MEMS device at the stage to etch the substrate.
Figure 1:
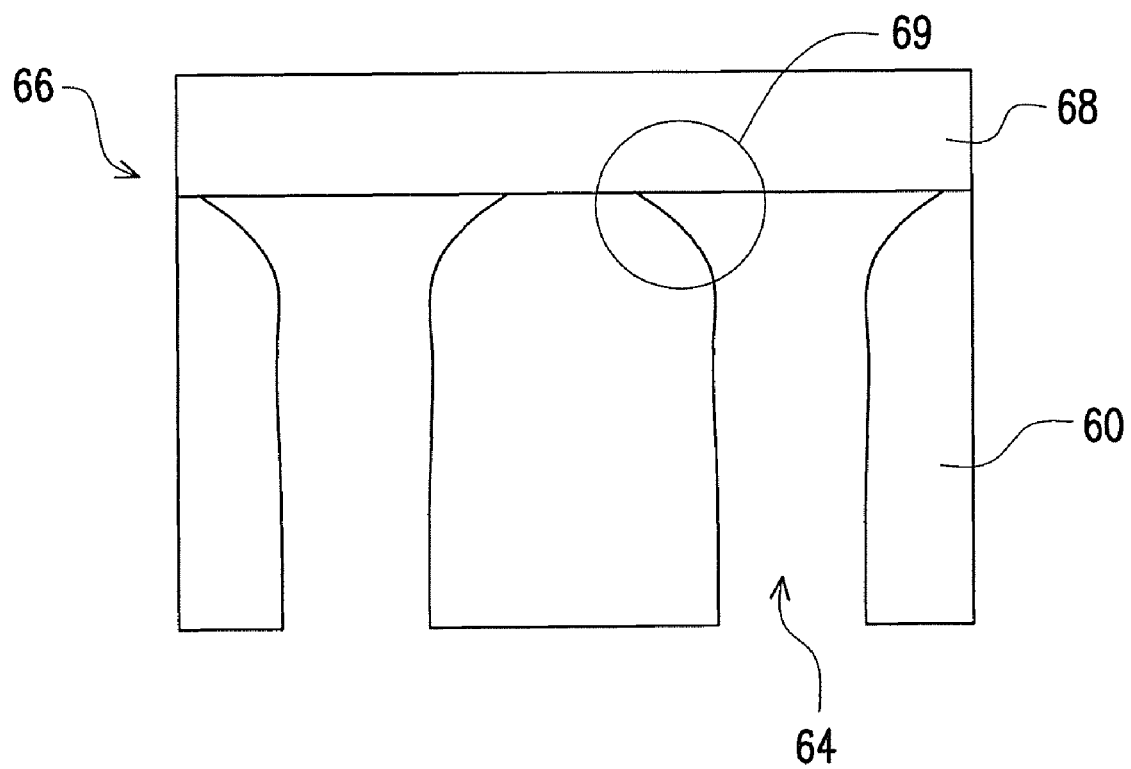

In addition, the substrate 100 for the MEMS device 80 needs to be patterned from the backside, so as to form a cavity 104 and the venting holes 106. As a result, for example, the air pressure variance from the sound can be detected by the diaphragm to serving as a microphone in one of various applications. In order to reduce the undercut as discussed in FIG. 1, the metal silicide 102 can be formed on the substrate 100 before forming the structural dielectric layer 108, so that when the venting holes 106 is formed under etching process, the metal silicide 102 can significantly prevent the undercut from occurring. After fabrication, a portion of the metal silicide layer 102 remains. This is because the need in fabrication, so as to reduce the undercut.

Figure 4:
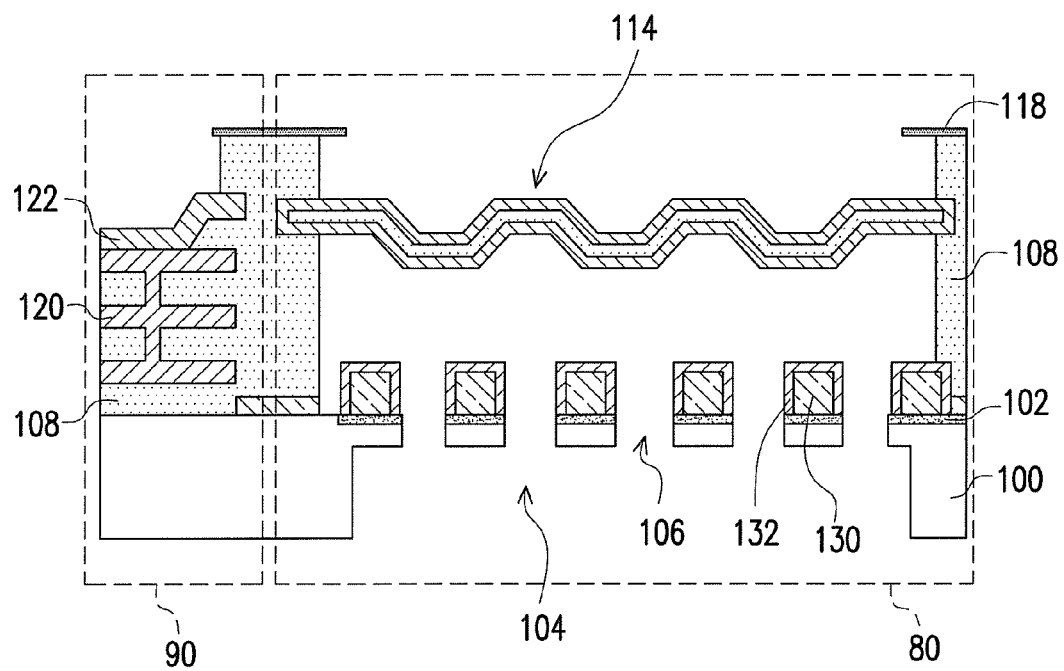
FIG. 4 is a cross-sectional view, schematically illustrating a MEMS device, according to another embodiment of the invention.

FIG. 4 is a cross-sectional view, schematically illustrating a MEMS device, according to another embodiment of the invention. In FIG. 4, the structure is like the structure in FIG. 3. However, several metal blocks with metal layer 132 and the dielectric 130 enclosed by the metal layer 132 can be also formed on the metal silicide layer 102. The metal layers 132 are used to decrease the gap of microphone capacitance between the diaphragm 114 and the substrate 100, for example.

Figure 5A:
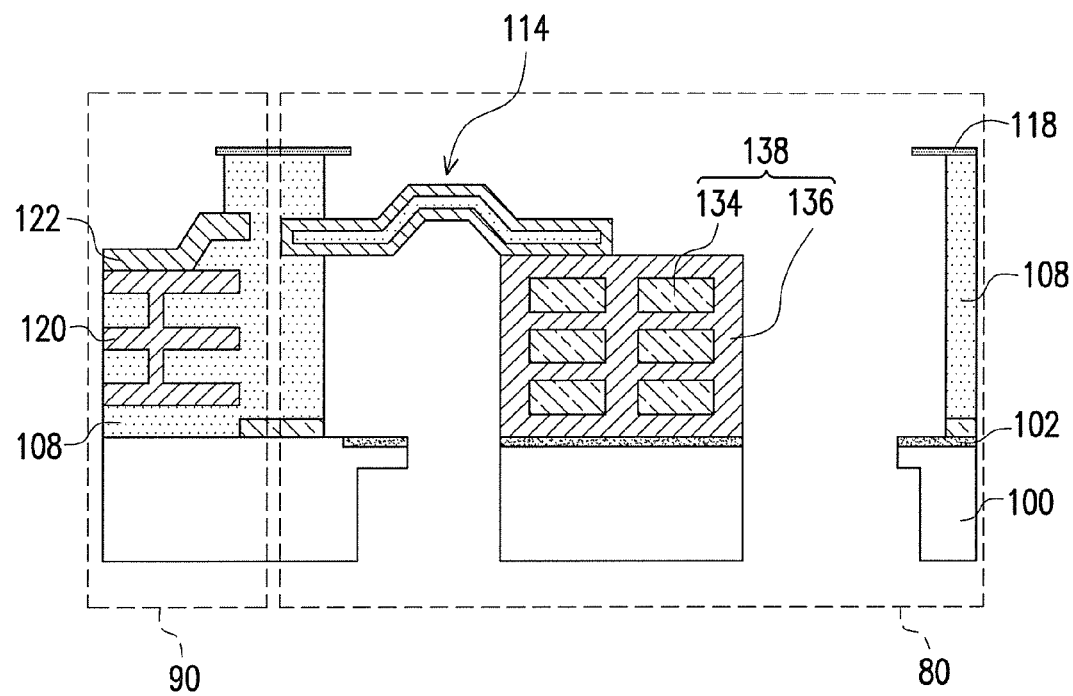
FIGS. 5A-5B are cross-sectional views, schematically illustrating a MEMS device, according to another embodiment of the invention.
Figure 5B:
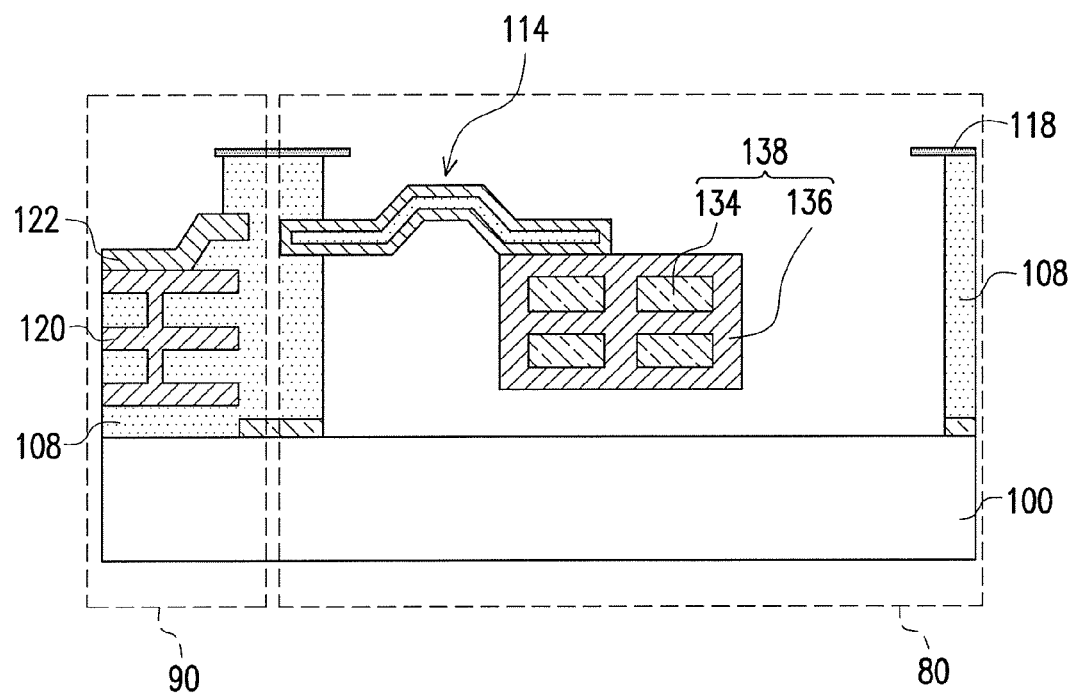

FIGS. 5A-5B are cross-sectional views, schematically illustrating a MEMS device, according to another embodiment of the invention. In FIG. 5A, the MEMS device can be in the application for sensing acceleration speed, for example. In this situation, the suspension beam 114 is serving as a spring to hold the mass bulk 138. The mass bulk 138 can include, for example, the metal layer 136 and the dielectric 134 therein. The mass bulk 138 has sufficient mass to sense the acceleration by external force. In order to etch the dielectric to expose the suspension beam, the hard mask layer 118 is used as the etching mask and also protecting the CMOS circuit 90.

In FIG. 5B, since MEMS device 80 is not used to sensing air pressure, the cavity 104 and the venting hole 106 in the substrate in FIG. 5A are not necessary. As a result, the substrate 100 remains without cavity and venting holes. In this situation, the metal silicide is not necessarily formed on the substrate and therefore not seen in the later stage of structure. However, the issue of long etching time still exits and can be solved by the fabrication processes as to be described later.

Figure 6A:
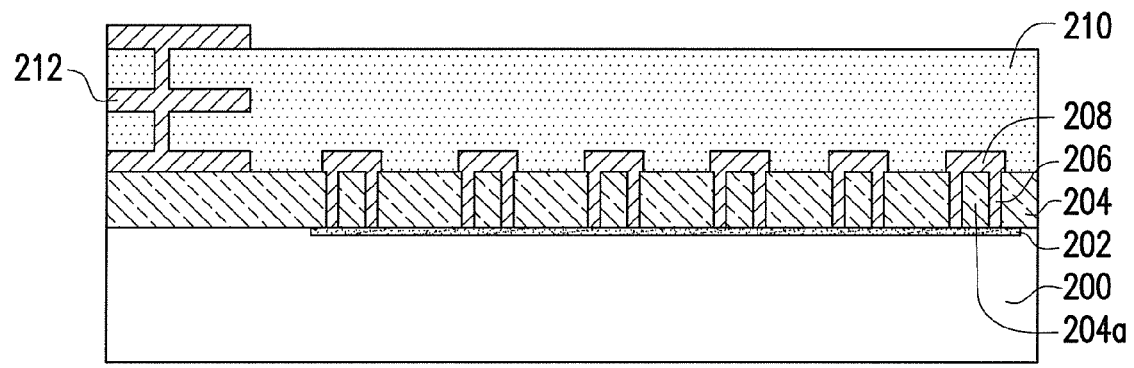
FIGS. 6A-6G are cross-sectional views, schematically illustrating the fabricating processes for the MEMS device, according to an embodiment of the invention.

FIGS. 6A-6G are cross-sectional views, schematically illustrating the fabricating processes for the MEMS device, according to an embodiment of the invention. In FIG. 6A, a substrate 200 is provided as the structure base. A metal silicide layer 202 is formed on the surface of the substrate 200 at the region for forming the MEMS device. An oxide layer 204, such as FSG, BSG, PSG, ASG, SOG or BPSG, is formed over the substrate 200 and covers the metal silicide layer 202. The oxide layer 204 has larger etching rate than the usual silicon dioxide, so that the etching time can be reduced so as to have the balance, when the diaphragm is exposed by isotropic etching process, as to be described later. The metal walls 206 are formed in the oxide layer 204 at the predetermined locations, to surround the venting holes, which are to be form later. The top metal layer 208 covers the metal walls 206. As a result, the metal block is formed including the metal layer 206 and 208 and the dielectric 204a being covered therein. A structural dielectric layer 210 is formed on the oxide layer 204. The structural dielectric layer 210 includes the interconnect structure 212 embedded therein. However, from the structure point of view, the structural dielectric layer 210 and the oxide layer 204 and even later dielectric layer above the substrate 200 can be generally referred as the same structural dielectric layer although the etching rate of the oxide layer 204, as a sacrificial layer, has the effect during fabrication process. The part relating the CMOS circuit is not described in detail but understandable. The interconnect structure 212 is part of the CMOS circuit.

Figure 6B:
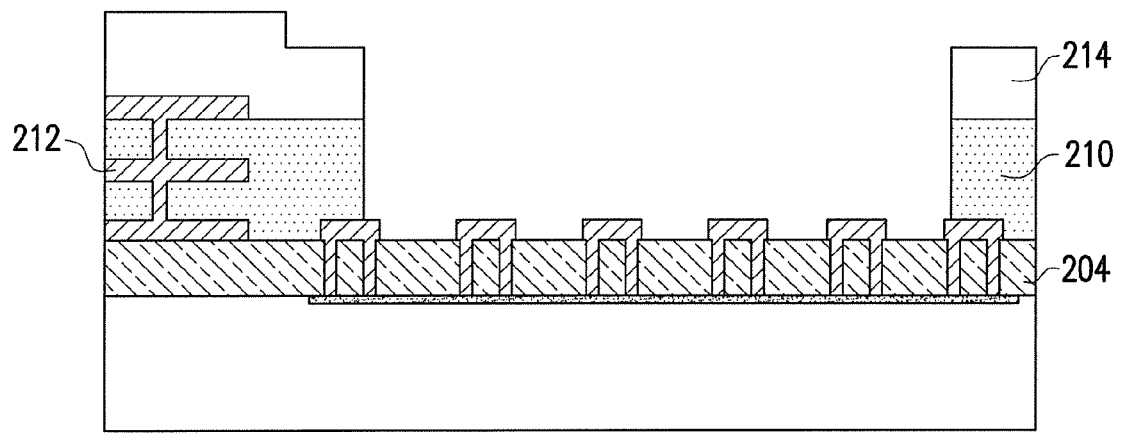

In FIG. 6B, a photoresist layer 214 is formed on the structural dielectric layer 210 with an opening to expose the MEMS region to be form the MEMS device. Using the photoresist layer 214 as the etching mask, the dielectric material of the structural dielectric layer 210 is etched to have an opening, which exposes the oxide layer 204 and the metal layer 208.

Figure 6C:
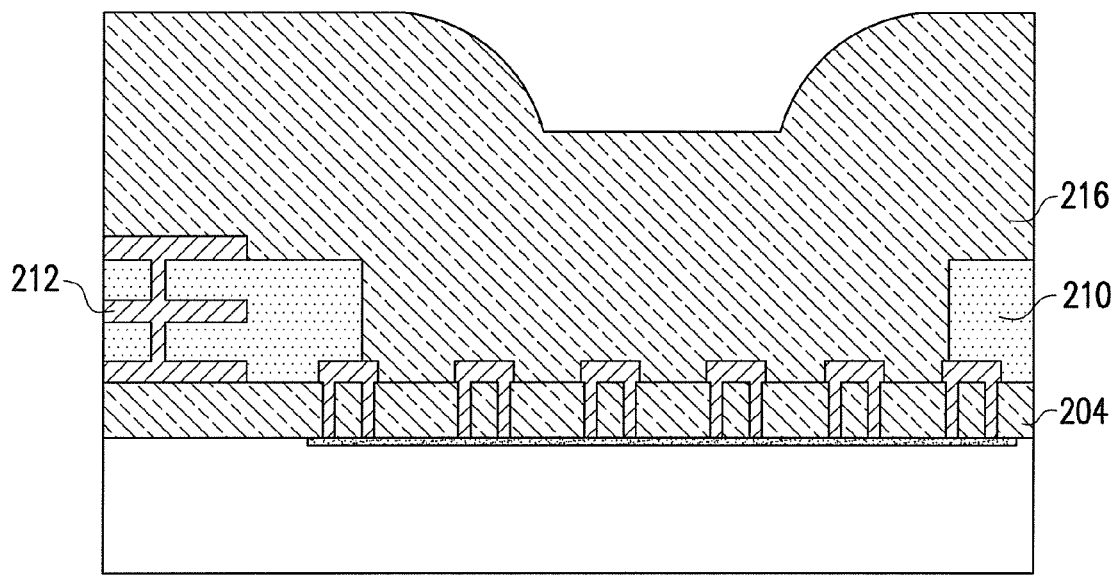
Figure 6D:
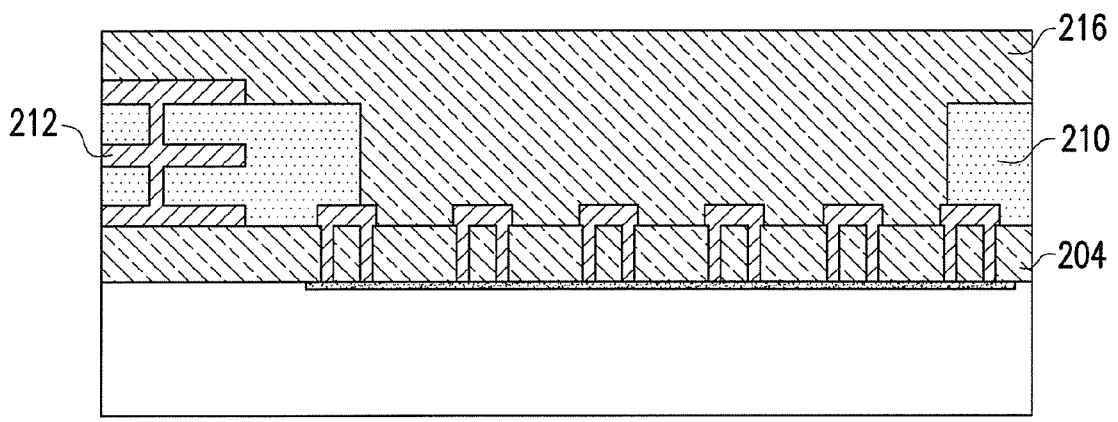

In FIG. 6C, after the photoresist layer 214 is removed, another dielectric layer 216, which is also sacrificial, is deposited over the oxide layer 210 and fill the opening of the structural dielectric layer 210 in contact with the oxide layer 210. The dielectric layer 216 can be, for example, FSG, BSG, PSG, ASG, SOG, polyimide or BPSG. In one example, the dielectric layer 216 is the same as the oxide layer 204. In FIG. 6D, the dielectric layer 216 can be planarized by, for example, chemical mechanical polishing (CMP) process.

Figure 6E:
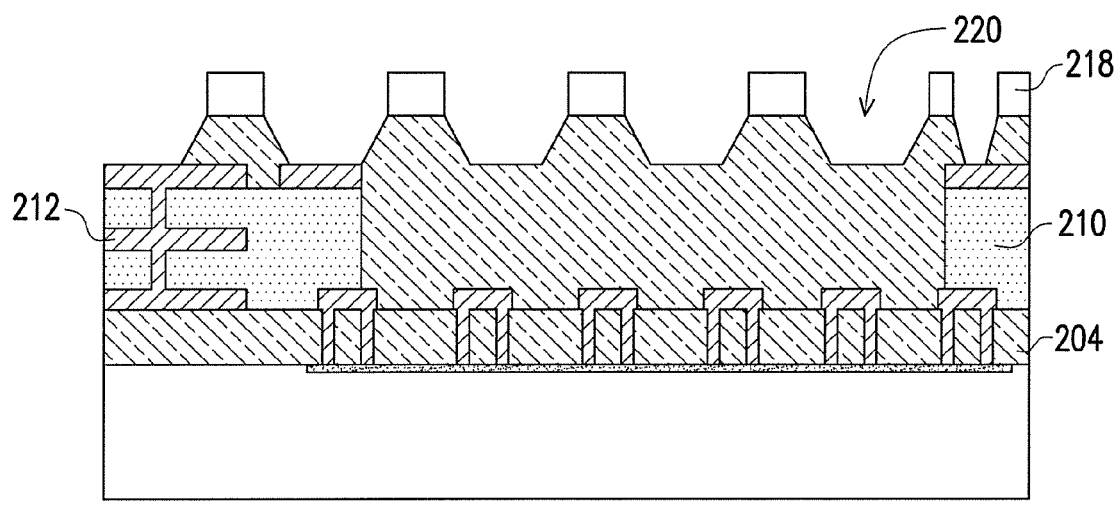

In FIG. 6E, another photoresist layer 218 with opening pattern is formed on the dielectric layer 216, servings as the etching mask. In order to form the corrugated structure for the diaphragm, the etching process can be controlled to etch the dielectric layer 216 to have the indent region 220, which has slant sidewall.

Figure 6F:
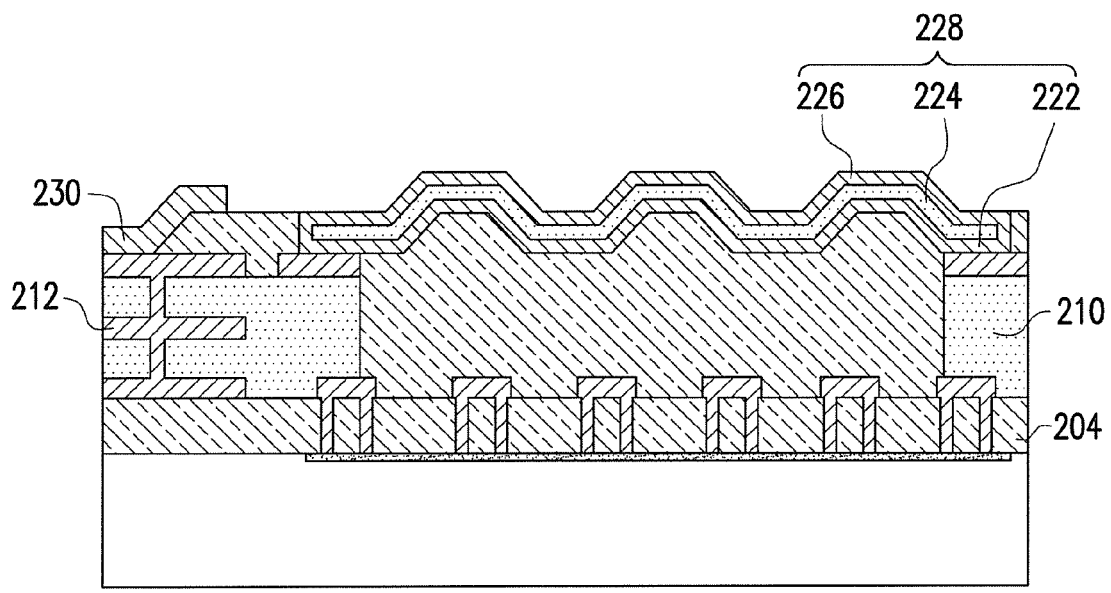

In FIG. 6F, after the photoresist layer 218 is removed, a diaphragm 228, including conductive layer 222 and conductive layer 226 for enclosing dielectric layer 224, can be formed in conformal to the shape of the indent region 220, so as to have the corrugated structure. However, the corrugate structure is not the only choice. The invention is not just limited to the corrugated diaphragm. In addition, the bonding pad 230 for the CMOS circuit can be formed as well.

Figure 6G:
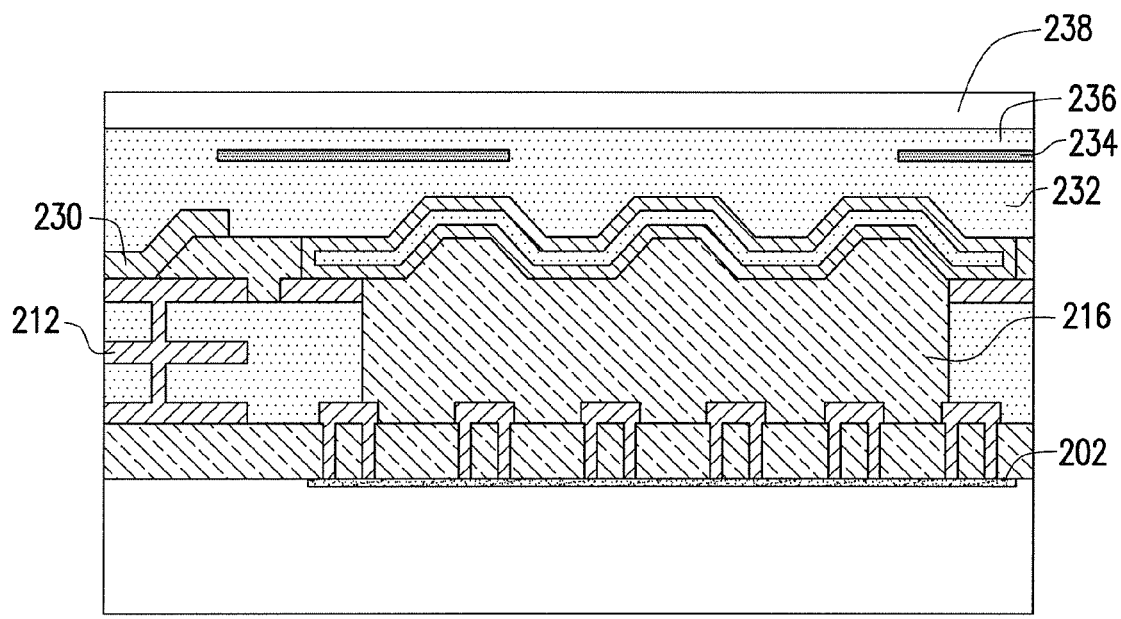

In FIG. 6G, another dielectric layer 232 is formed over the diaphragm 228. A hard mask layer 234 is formed on the dielectric layer 232. The hard mask layer 234 has an opening corresponding to the diaphragm. The hard mask layer 234 can protect the CMOS circuit when the etching process performed later. Another dielectric layer 236 is formed over the dielectric layer 232 and covers the hard mask layer. The dielectric layer 236 and the dielectric layer 232 can be the same material, such as silicon oxide. Another dielectric layer 238 is formed on the dielectric layer 232.

It should be noted that the total amount of the dielectric material to be removed above the diaphragm 228 is less than the total amount of the dielectric material to be removed under the diaphragm 228. Further, the dielectric material under the diaphragm 228 is etched from the venting holes, which are to be formed later. The material for the dielectric layer 238, serving as a sacrificial layer, has lower in etching rate than the oxide layer 216. This would cause a time balance in isotropic etching for exposing the diaphragm 228 later, in which a local region of the conductive layers of the diaphragm would not be exposed to the etchant being too long. The material for the dielectric layer 238 can be, for example, silicon nitride, silicon-riched oxide, SiON, etc.

Figure 7:
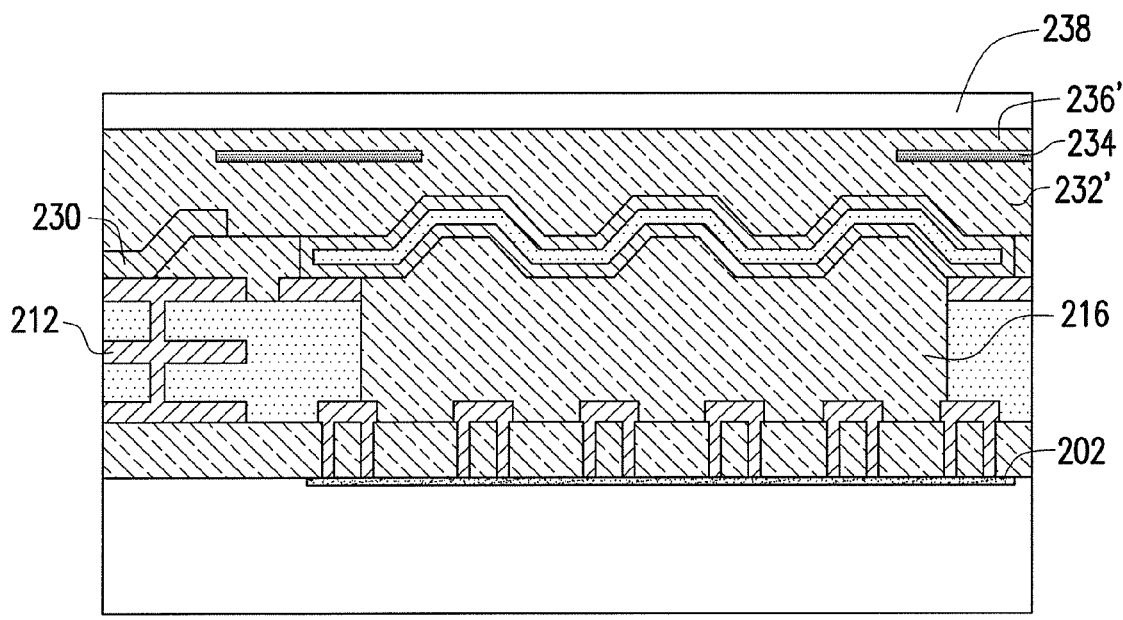
FIGS. 7-11 are cross-sectional views, schematically illustrating several different processes for fabricating the MEMS device, according to several embodiments of the invention.

FIGS. 7-11 are cross-sectional views, schematically illustrating several different processes for fabricating the MEMS device, according to several embodiments of the invention. In FIG. 7, when comparing with FIG. 6G, the different is the dielectric layer 232' and 236' can also take the same material as the oxide layer 216.

Figure 8:
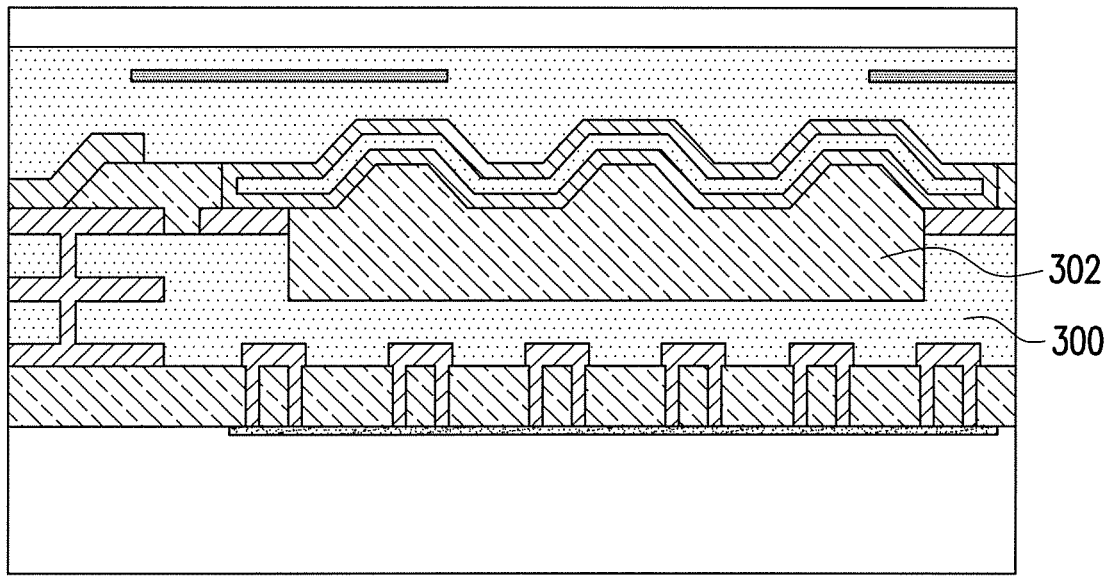

In FIG. 8, when comparing with FIG. 6B, the dielectric layer 300 is not etched to expose the dielectric layer 204. Then, the oxide layer 302 is filled into the indent region by the same subsequent process.

Figure 9:
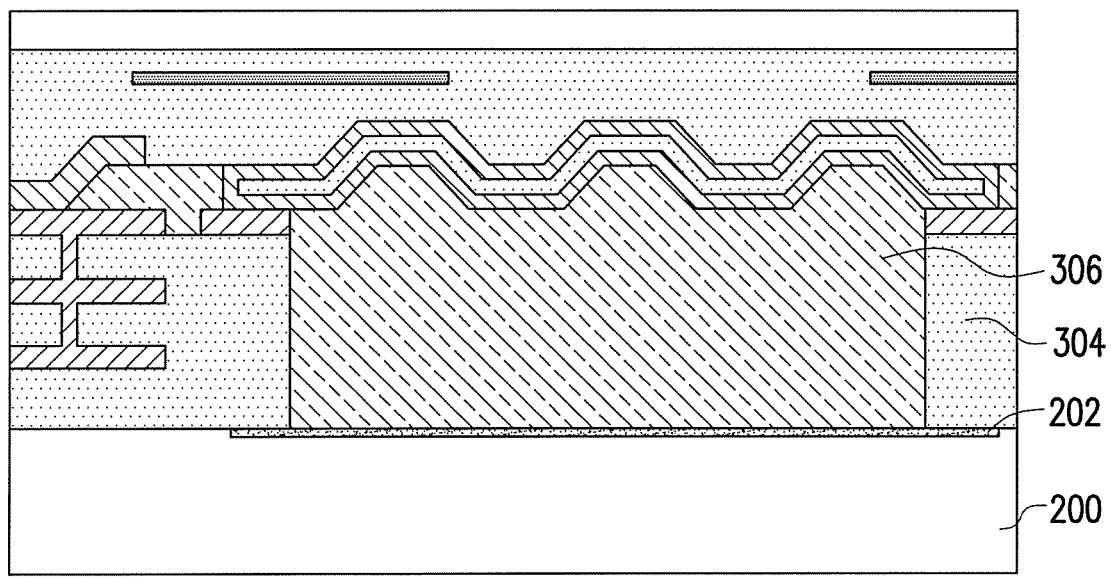

In FIG. 9, when comparing with FIG. 6A, the metal blocks are not included. As a result, the dielectric layer 304 is patterned to have a hole for expose the metal silicide layer 202, and then the sacrificial oxide layer 306 is filled into the hole on the metal silicide layer 202.

Figure 10:
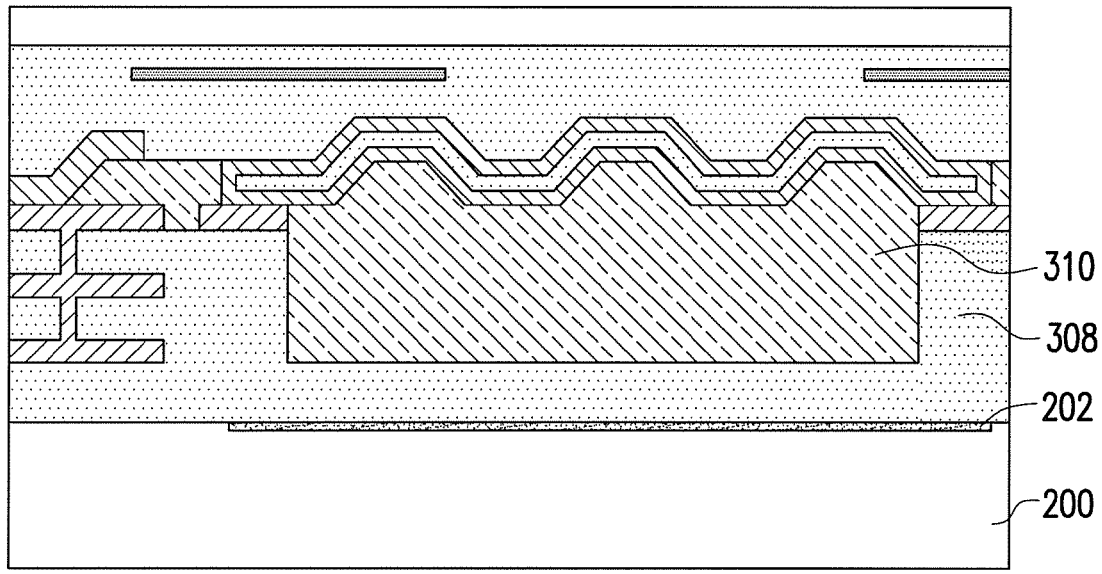

In FIG. 10, in alternative choice, the dielectric layer 308 like FIG. 8 is patterned to have the indent region. In addition, like FIG. 9, the metal blocks are not included. After the oxide layer 310 fills to the indent region, the subsequent processes are the same.

Figure 11:
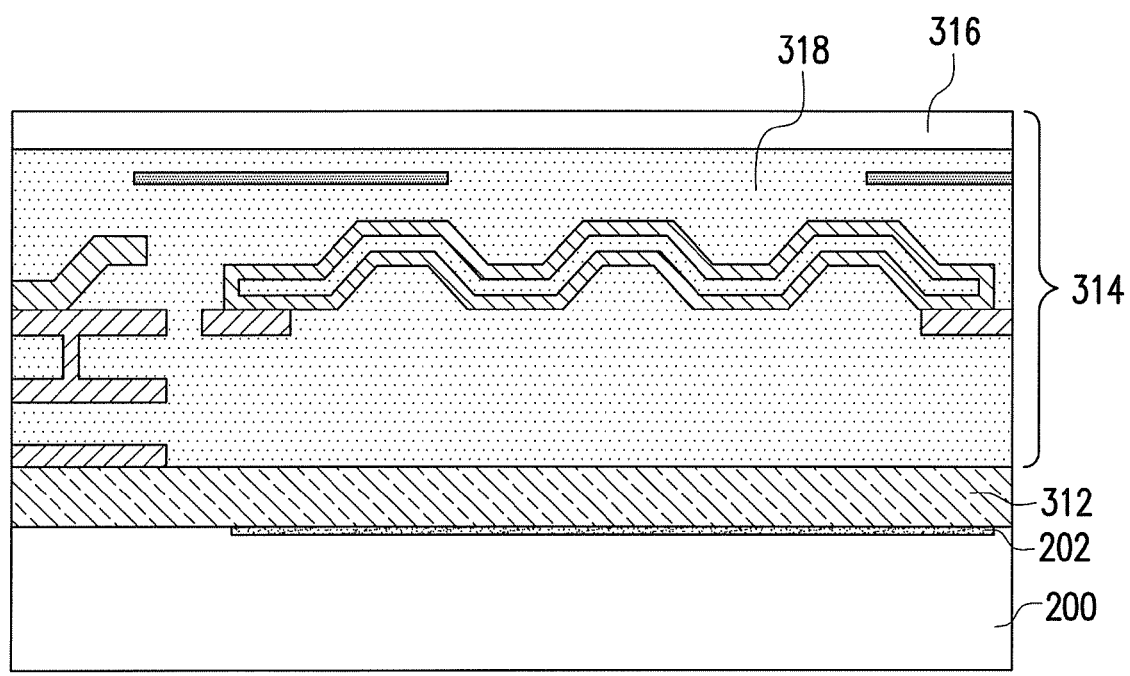

In FIG. 11, even further, the metal blocks are not included but the oxide layer 312 is formed over the substrate. The whole structural dielectric layer 314, including the dielectric 318 and the embedded device, is formed on the oxide layer 312.

Figure 12A:
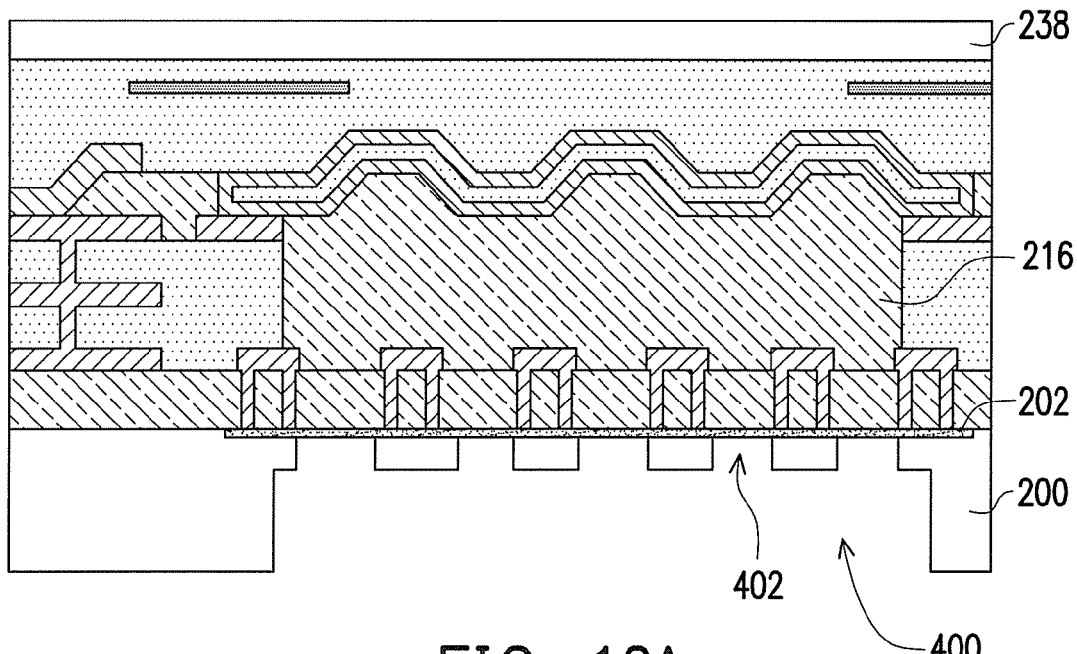
FIGS. 12A-12C are cross-sectional views, schematically illustrating the subsequent process for fabricating the MEMS device, according to an embodiment of the invention.
Figure 12B:
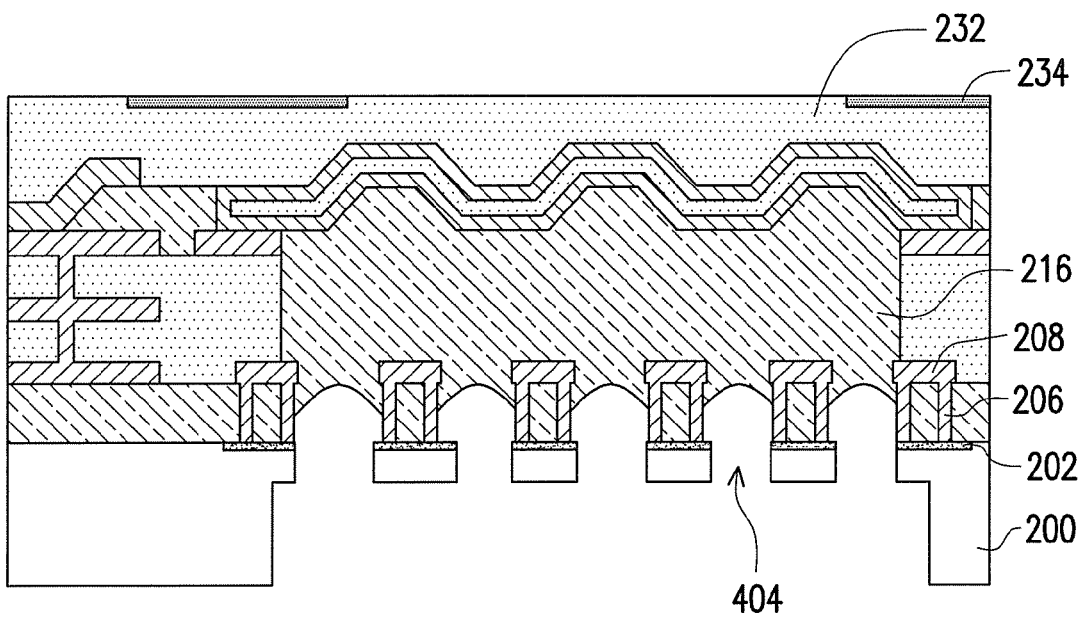
Figure 12C:
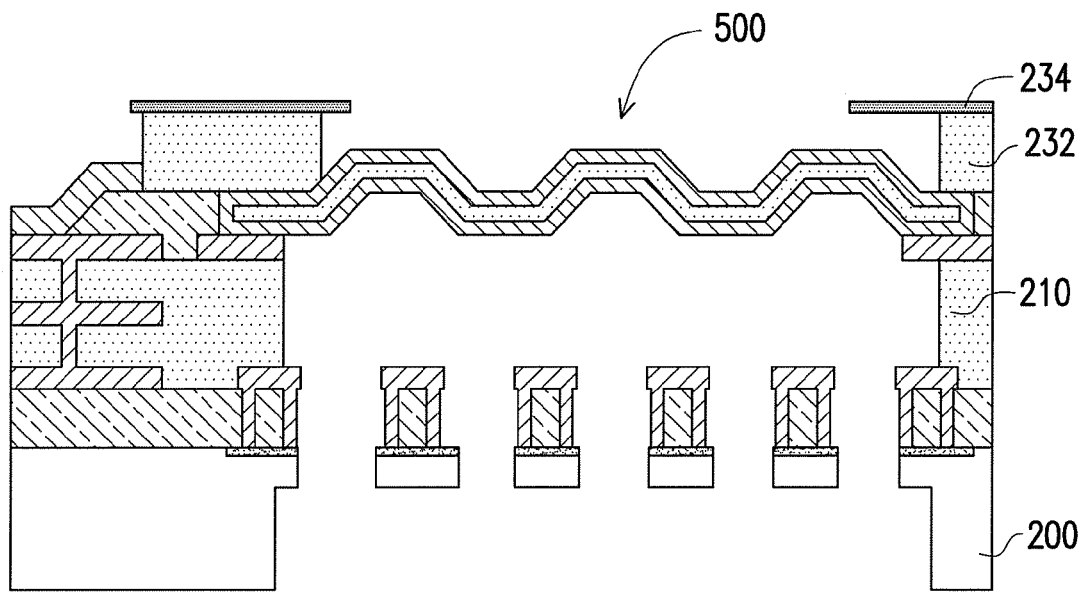

FIGS. 12A-12C are cross-sectional views, schematically illustrating the subsequent process for fabricating the MEMS device, according to an embodiment of the invention. In FIG. 12A, in continuous from FIG. 6G, the substrate 200 is patterned to have the cavity and the venting holes 402. Since the metal silicide 202 has bee formed on the substrate 200. The venting holes 402 can stop on the metal silicide 202. The undercut venting holes 402, as described in FIG. 1, can be reduced.

In FIG. 12B, an isotropic etching process in first-stage is performed from both sides of the substrate 200. As a result, the exposed portion of the metal silicide layer 202 within the venting holes 404 is etched and a portion of the oxide layer 216 is also etched to expose the metal layer 206 of the metal blocks. At the same time, the dielectric layer 238 on top of the front side of the substrate 200 is partially or fully removed. In this embodiment, the dielectric layer 238 is removed at the first-stage etching process, and the hard mask layer is exposed.

In FIG. 12C, the second-stage etching process is continuously performed with the same etching condition for different etching condition. However, since the effect of the hard mask layer 234, the some of the dielectric layer 232 under the hard mask layer 234 still remains for supporting the end portion of the diaphragm. The oxide layer 216 at the back side is continuously etched with fast etching rate via the venting holes 404. Since the balance of the etching by choosing the sacrificial dielectric layer 238 and the oxide layer 216, both sides of the diaphragm 500 are exposed about at the same time without leaving some local region for exposing to the etchant for long time. Damage on the diaphragm 500, due to etching, can be reduced. Also and, due to the effect of metal silicide 202, the venting holes 404 have better profile with prevention of the undercut.

Figure 13A:
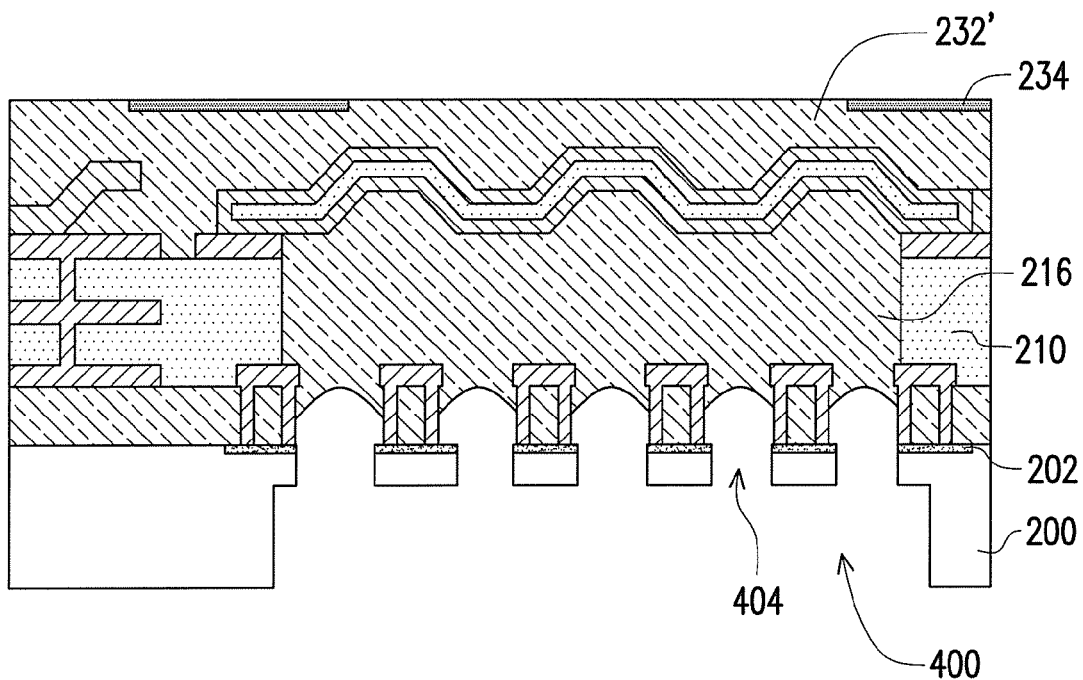
FIGS. 13A-13B are cross-sectional views, schematically illustrating the subsequent process for fabricating the MEMS device, according to an embodiment of the invention.
Figure 13B:
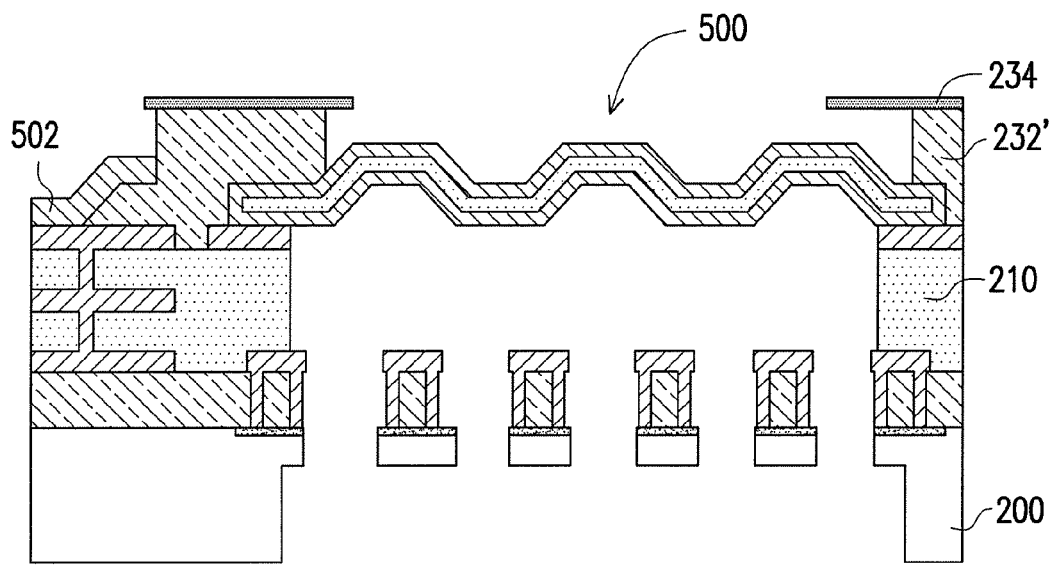

FIGS. 13A-13B are cross-sectional views, schematically illustrating the subsequent process for fabricating the MEMS device, according to an embodiment of the invention. In FIG. 13A, in continuation form FIG. 7, similarly, the substrate 200 is patterned to have cavity 400 and the venting holes 404. The first-stage of the isotropic etching process is performed to expose, for example, the hard mask layer 234 and the dielectric layer 232' at the front side of the substrate 200 while the oxide layer 216 has been etched by a certain portion. However in alternative option, a portion of the sacrificial dielectric layer 238 may still remain, in which the hard mask layer 234 is not exposed yet, and then is exposed later. The bonding pad 502 for connection to the CMOS interconnection is also formed. In FIG. 13B, the second-stage of the isotropic etching process is continuously performed to expose the diaphragm 500. Since the etching rate is relative fast and balanced, damage on the diaphragm 500 due to etching process is reduced.

Figure 14A:
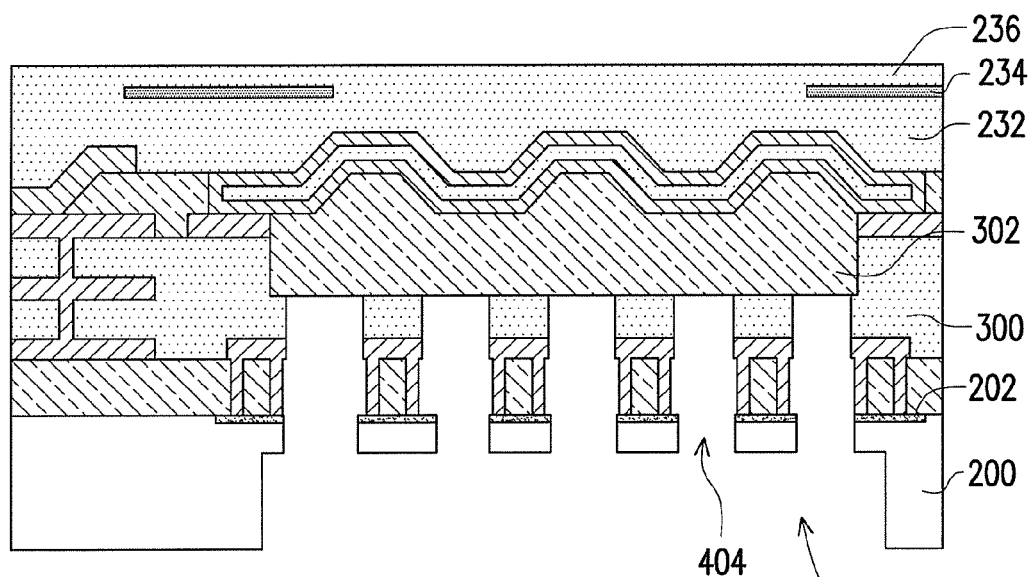
FIGS. 14A-14B are cross-sectional views, schematically illustrating the subsequent process for fabricating the MEMS device, according to an embodiment of the invention.
Figure 14B:
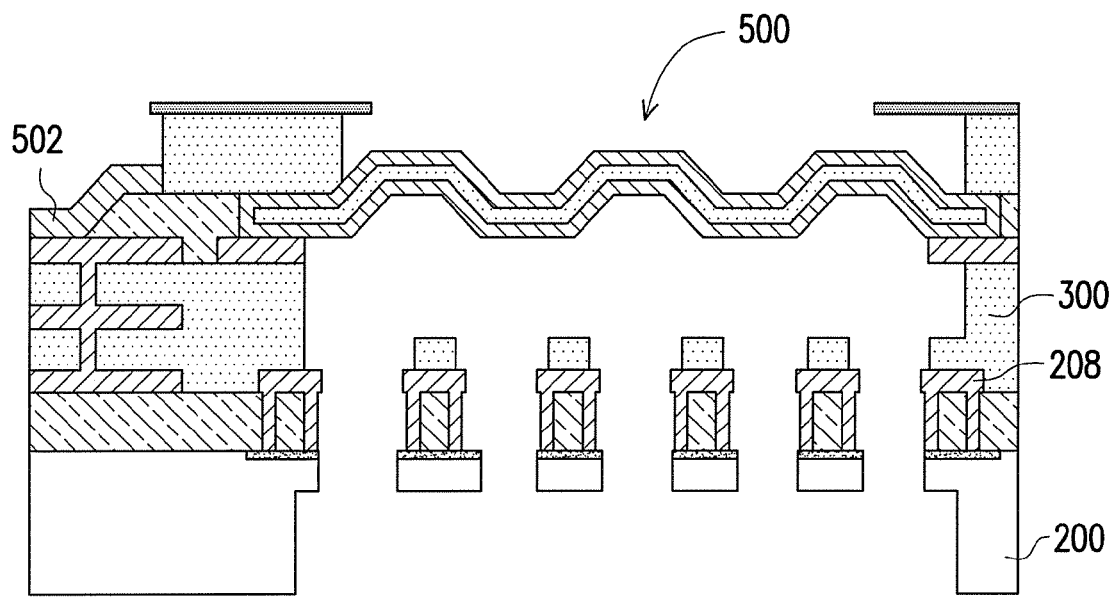

FIGS. 14A-14B are cross-sectional views, schematically illustrating the subsequent process for fabricating the MEMS device, according to an embodiment of the invention. In FIG. 14A, in continuation form FIG. 8, similarly, the substrate 200 is patterned to have cavity 400 and the venting holes 404. The first-stage of the isotropic etching process is performed to expose the dielectric layer 236 at the front side of the substrate 200 while the dielectric layer 300 has been etched by a certain portion to expose the oxide layer 302. However in alternative option, a portion of the sacrificial dielectric layer 238 may still remain. In FIG. 14B, the second-stage of the isotropic etching process is continuously performed to expose the diaphragm 500. Since the etching rate is relative fast and balanced, damage on the diaphragm 500 due to etching process is reduced. The dielectric layer 300 may have residue portion on the metal block.

Figure 15A:
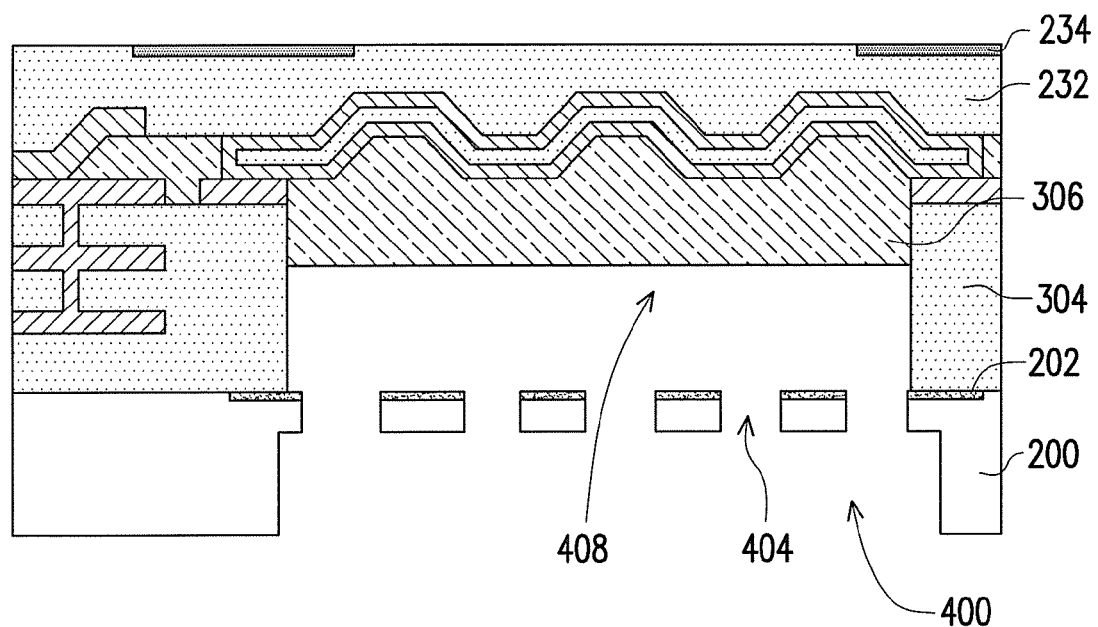
FIGS. 15A-15B are cross-sectional views, schematically illustrating the subsequent process for fabricating the MEMS device, according to an embodiment of the invention.
Figure 15B:
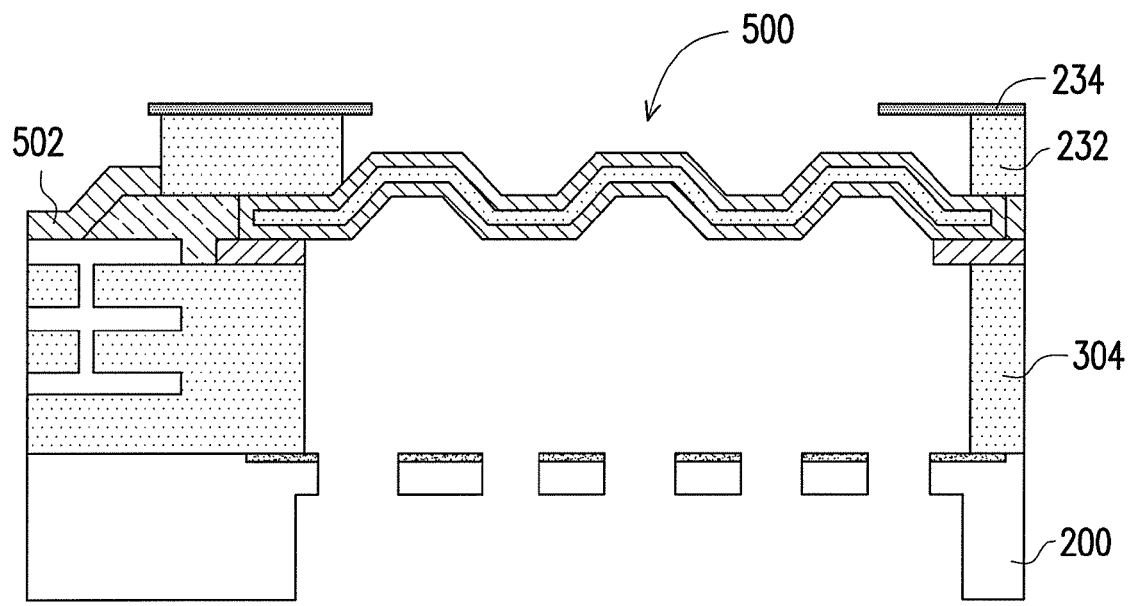

FIGS. 15A-15B are cross-sectional views, schematically illustrating the subsequent process for fabricating the MEMS device, according to an embodiment of the invention. In FIG. 15A, in continuation form FIG. 9, similarly, the substrate 200 is patterned to have cavity 400 and the venting holes 404. The first-stage of the isotropic etching process is performed to expose, for example, the hard mask layer 234 and the dielectric layer 232 at the front side of the substrate 200 while the oxide layer 306 has been etched by a certain portion. However in alternative option, a portion of the sacrificial dielectric layer 238 may still remain, in which the hard mask layer 234 is not exposed yet, and then is exposed later. In FIG. 15B, the second-stage of the isotropic etching process is continuously performed to expose the diaphragm 500. Since the etching rate is relative fast and balanced, damage on the diaphragm 500 due to etching process is reduced.

Figure 16A:
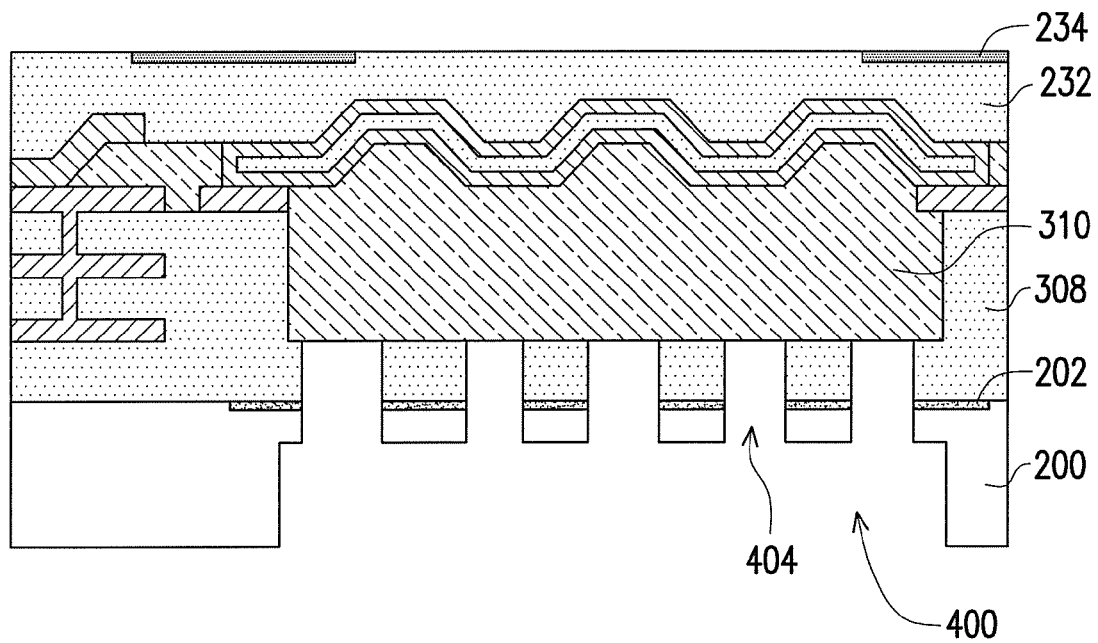
FIGS. 16A-16B are cross-sectional views, schematically illustrating the subsequent process for fabricating the MEMS device, according to an embodiment of the invention.
Figure 16B:
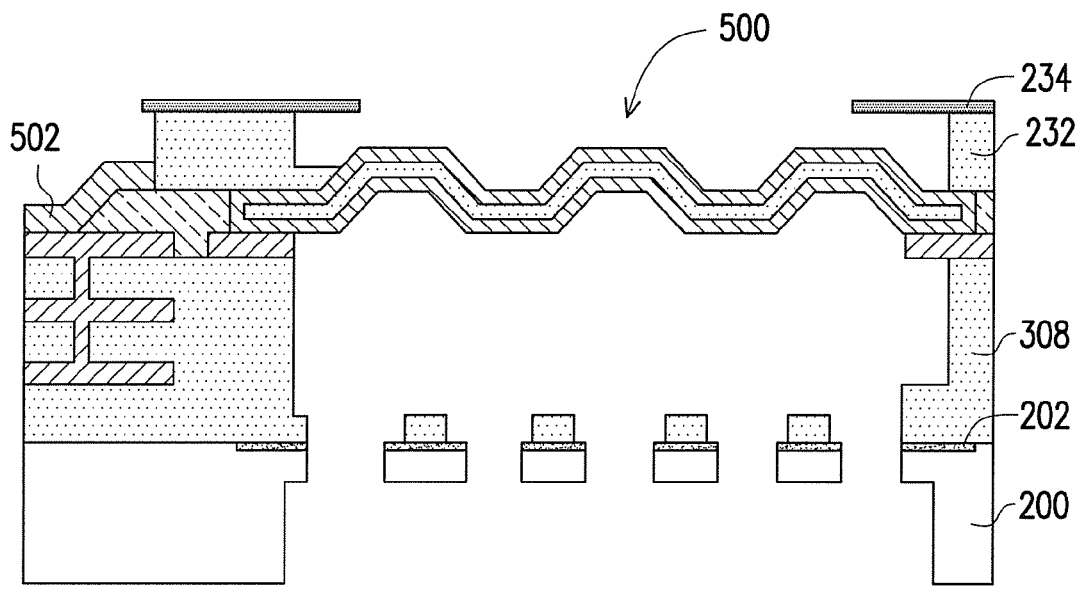

FIGS. 16A-16B are cross-sectional views, schematically illustrating the subsequent process for fabricating the MEMS device, according to an embodiment of the invention. In FIG. 16A, in continuation form FIG. 10, similarly, the substrate 200 is patterned to have cavity 400 and the venting holes 404. The first-stage of the isotropic etching process is performed to expose the dielectric layer 232 and the hard mask layer 234 at the front side of the substrate 200 while the dielectric layer 308 has been etched by a certain portion to expose the oxide layer 310. However in alternative option, a portion of the sacrificial dielectric layer 238 may still remain. In FIG. 16B, the second-stage of the isotropic etching process is continuously performed to expose the diaphragm 500. Since the etching rate is relative fast and balanced, damage on the diaphragm 500 due to etching process is reduced. The dielectric layer 210 may have residue portion on the metal block.

Figure 17A:
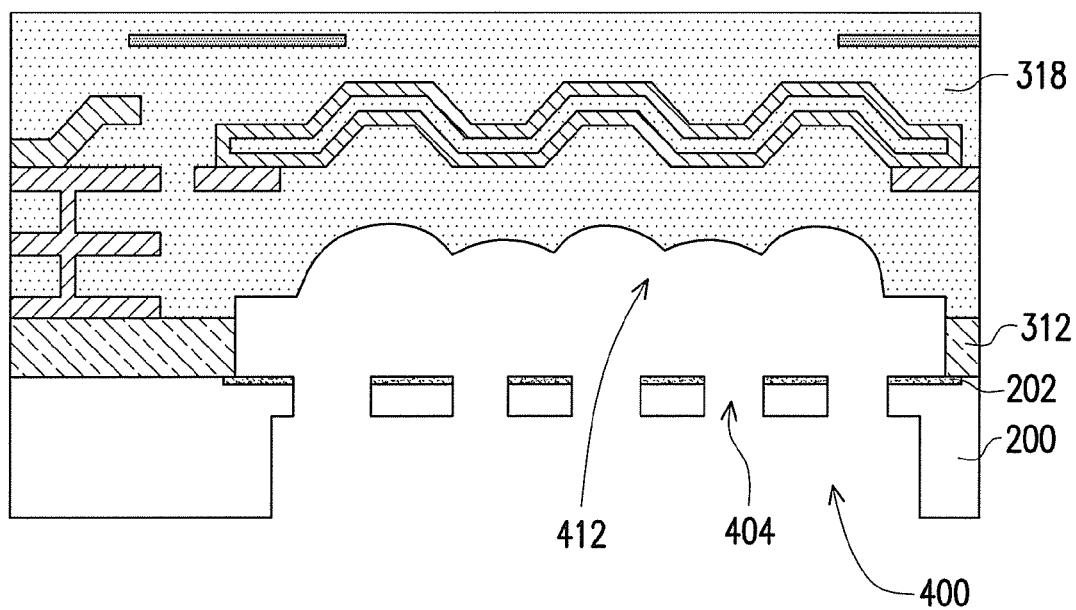
FIGS. 17A-17B are cross-sectional views, schematically illustrating the subsequent process for fabricating the MEMS device, according to an embodiment of the invention.
Figure 17B:
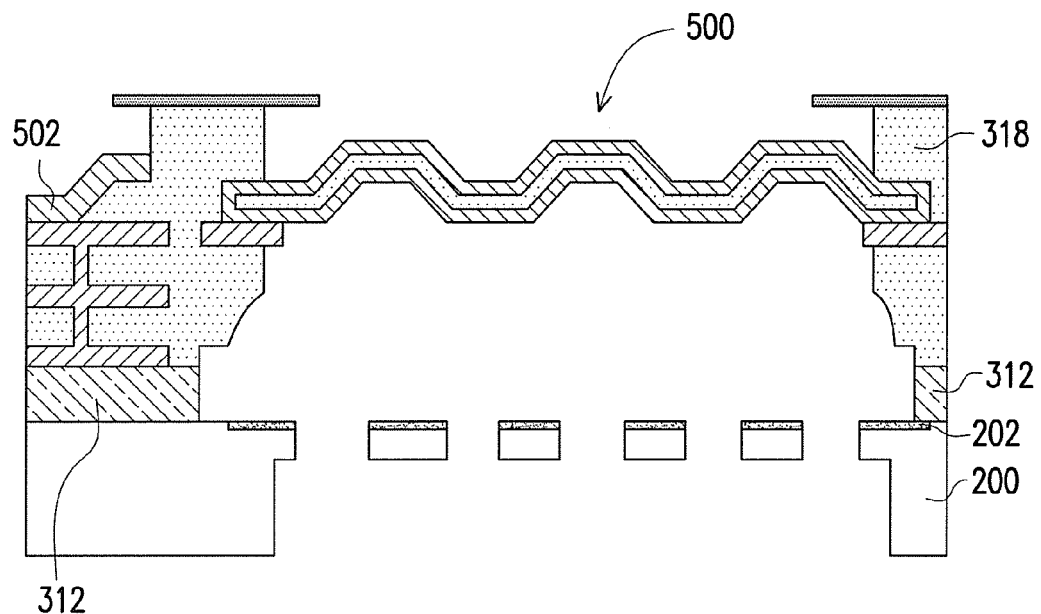

FIGS. 17A-17B are cross-sectional views, schematically illustrating the subsequent process for fabricating the MEMS device, according to an embodiment of the invention. In FIG. 17A, in continuation form FIG. 11, similarly, the substrate 200 is patterned to have cavity 400 and the venting holes 404. The first-stage of the isotropic etching process is performed to expose the dielectric layer 318 at the front side of the substrate 200 while the oxide layer 312 and a portion dielectric layer 318 under the diaphragm has been etched. However in alternative option, a portion of the sacrificial dielectric layer 238 may still remain. In FIG. 17B, the second-stage of the isotropic etching process is continuously performed to expose the diaphragm 500. Since the etching rate is relative fast and balanced, damage on the diaphragm 500 due to etching process is reduced. The dielectric layer 210 may have residue portion on the metal block.

The foregoing MEMS diaphragm can be, for example, used for sensing air pressure, like the use in microphone. However, the MEMS device can also be used to sense the acceleration speed. FIGS. 18A-18H are cross-sectional views, schematically illustrating a fabrication process for fabricating a MEMS device, according to an embodiment of the invention.

Figure 18A:
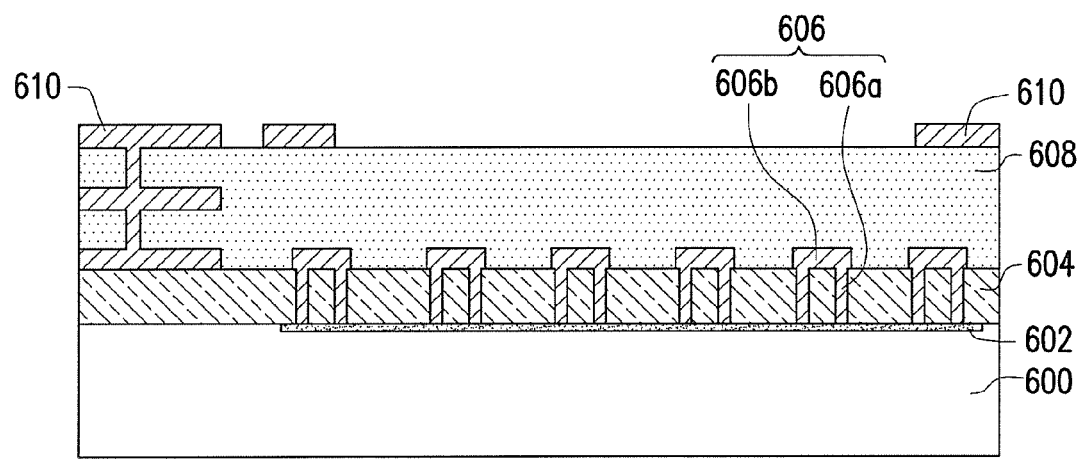
FIGS. 18A-18H are cross-sectional views, schematically illustrating a fabrication process for fabricating a MEMS device, according to an embodiment of the invention.

In FIG. 18A, a substrate 600 is provided. A metal silicide layer 602 is formed on the substrate 600 at the region to be formed with the MEMS device subsequently. A sacrificial dielectric layer 604 is formed over the substrate 600 and the metal silicide layer 602. A plurality of vertical metal walls 606a is formed in the sacrificial dielectric layer 604 on the substrate 600. Metal layers 606b are also formed on the sacrificial dielectric layer 604 to cover the vertical metal walls 606a in pairs. As a result, a metal block 606 is formed with enclosed dielectric portion. The process to form the metal block 606 can be, for example, patterning the sacrificial layer 608 to have the narrow openings to expose the metal silicide layer 602. Then, a primary matter layer is disposed over the sacrificial layer 604 and also fills the narrow openings to formed the vertical metal walls 606a. A planarization process by chemical mechanical polishing (CMP) process is performed to polish the primary layer. A patterning is performed on the primary metal layer to form the metal layers 606b.

Figure 18B:
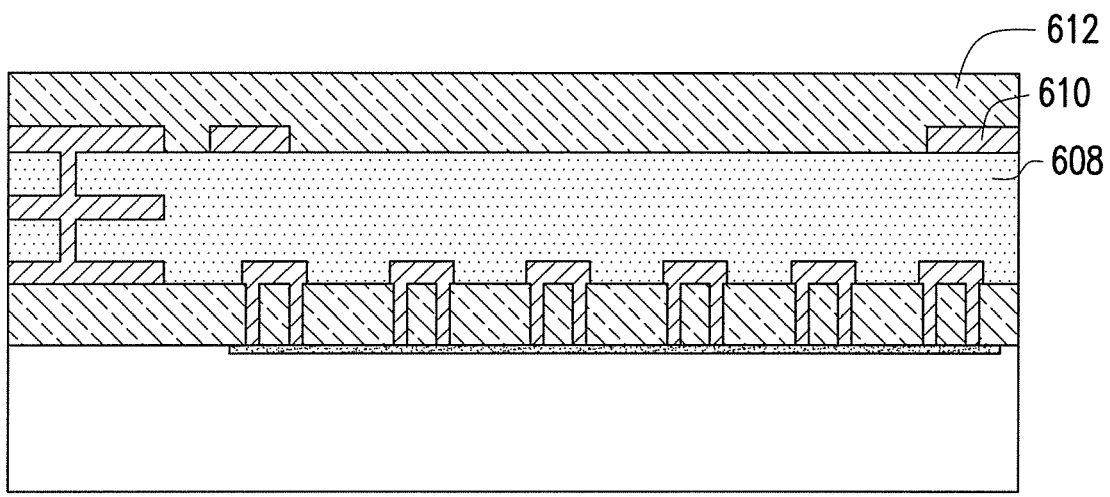

However, the above process is not the only manner. A structural dielectric layer 608 with the metal structure 610 is formed over the sacrificial dielectric layer 604. A top layer of the metal structure 610 is on the sacrificial dielectric layer 604 and is exposed, for example. In FIG. 18B, another sacrificial dielectric layer 612 is formed over the structural dielectric layer 608.

Figure 18C:
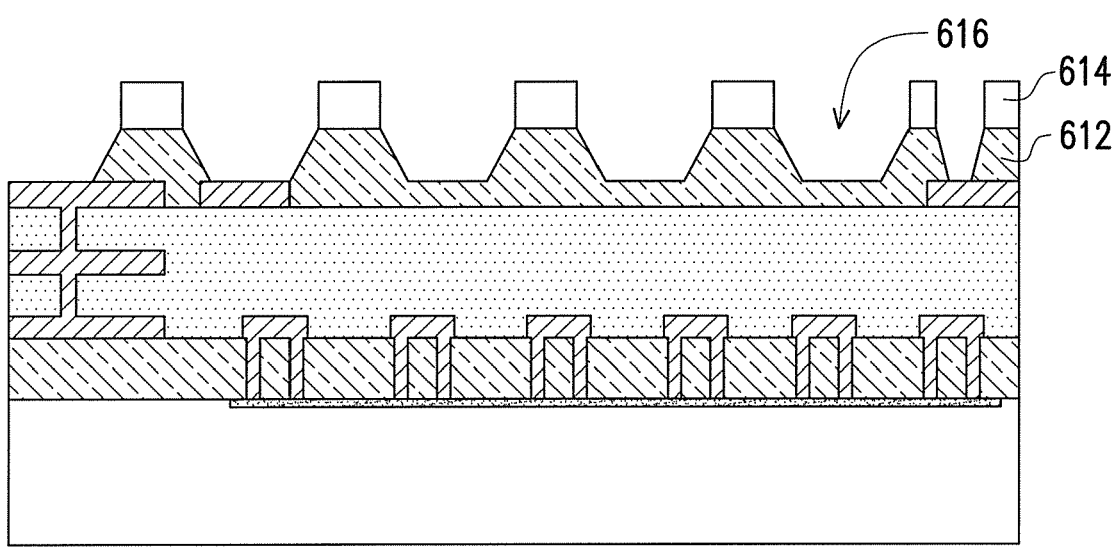

In FIG. 18C, a photoresist layer 614 with a pattern of openings is formed on the sacrificial layer 612. The openings expose sacrificial layer 612. An etching process is performed by using the photoresist layer 614 as the etching mask to form the indent regions 616. Since the etching process is at a condition with less strength of anisotropic etching, the side walls of the indent regions 616 is slant, so that an expected corrugate structure of the MEMS diaphragm can be formed later.

Figure 18D:
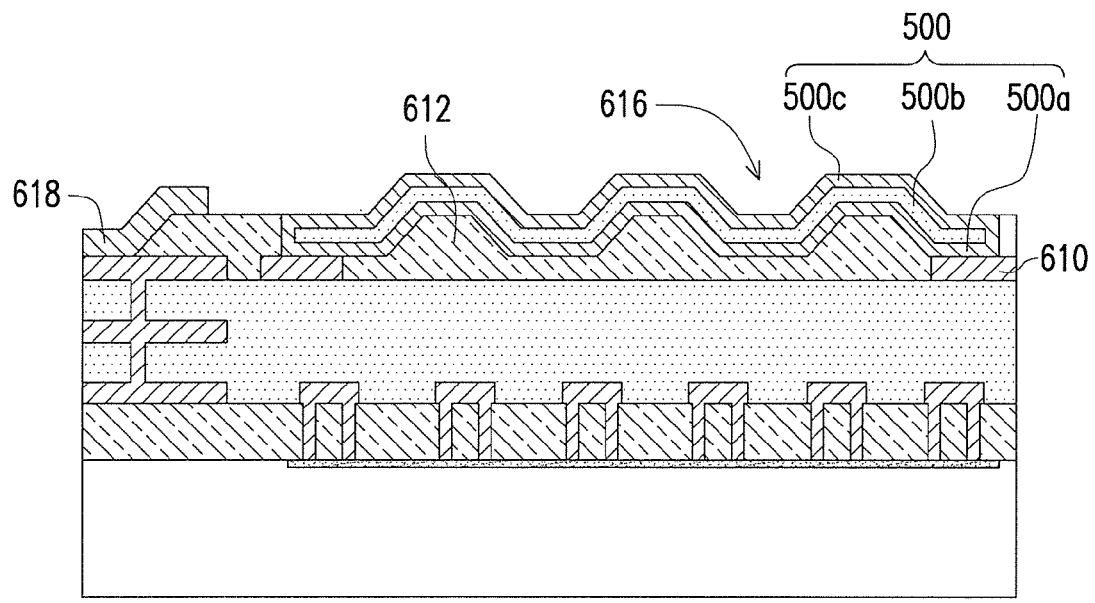

In FIG. 18D, after removing the photoresist layer, a corrugate diaphragm 500 being conformal to the indent region 616 is formed on the sacrificial layer 612. The corrugate diaphragm 500, as previously described, has a bottom conductive layer 500a and the top conductive layer 500c which the dielectric layer 500b is enclosed by the bottom conductive layer 500a and the top conductive layer 500c with the side portion. The corrugate diaphragm 500 may, for example, sit on the top layer of the metal structure 610 at the end portion, as a result, the corrugate diaphragm 500 is held. Additionally, the boding pad 618 or other structure belonging to the CMOS device can also be formed on the dielectric layer 610, optionally.

Figure 18E:
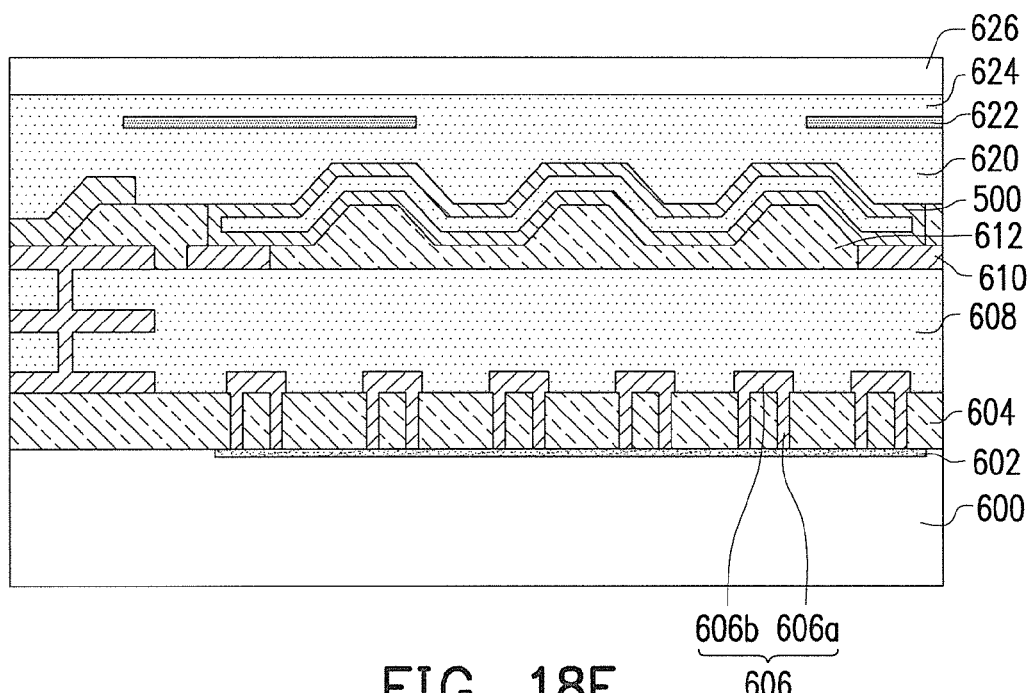

In FIG. 18E, a dielectric layer 620 is formed over the corrugate diaphragm 500. An etching stop layer 622 with an opening, corresponding to the MEMS device is formed on the dielectric layer 620. Another dielectric layer 624 is formed over the dielectric layer 620 to form a structural dielectric layer with the etchings stop layer 622 inside. After planarization on the dielectric layer 624, a further sacrificial dielectric layer 626 is formed on the dielectric layer 624.

Figure 18F:
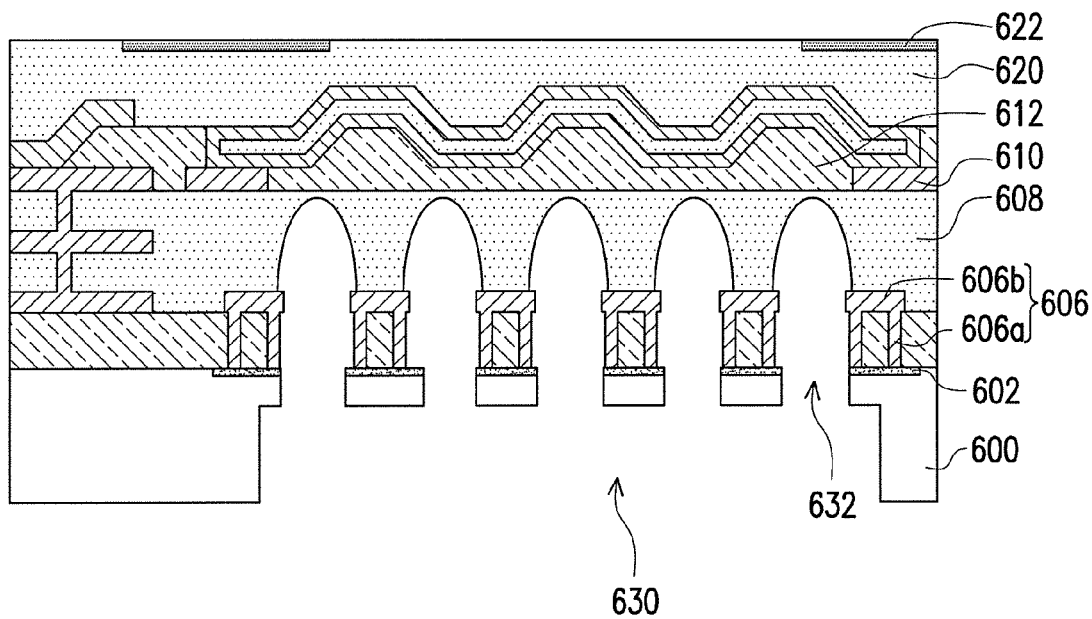

In FIG. 18F, the substrate 600 is patterned form the backside to form the cavity 630 and venting holes 632 to expose the metal silicide layer 602. The metal silicide layer can prevent the undercut for the venting holes 632 as previously described. Then, the isotropic etching process is performed from both sides of the diaphragm 500. The sacrificial layer 626 and the dielectric layer 624 are etched to expose the etching stop layer 622. On the backside, the metal silicide layer 602, the sacrificial dielectric layer 604 and the dielectric material of the structural dielectric layer 608 is etched by a large portion, for example, almost to expose the sacrificial dielectric layer 612. Here, the metal block 606 still remains but a side surface of the metal wall 606a is exposed.

Figure 18G:
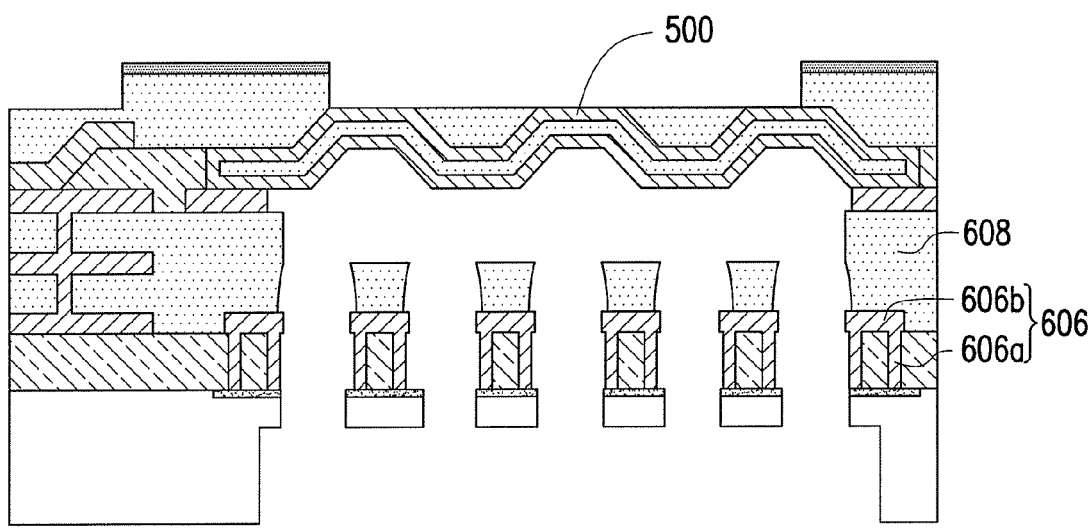

In FIG. 18G, the same isotropic etching process, which may be in the same etching condition or different etching condition, is continuously performed. Then, the backside of the diaphragm 500 is exposed while some residue of dielectric layer 608 may still remain on the metal block 606. The side portion of the dielectric layer 606 remains to servings as the mechanical support for the diaphragm 500. At the same isotropic etching process, the dielectric material of the dielectric layer 620 at the top side of the diaphragm 500 is also etched to expose the diaphragm 500. Due to the effect of the etchings stop layer 622, the dielectric material under the etching stop layer 622 is not completely etched away.

Figure 18H:
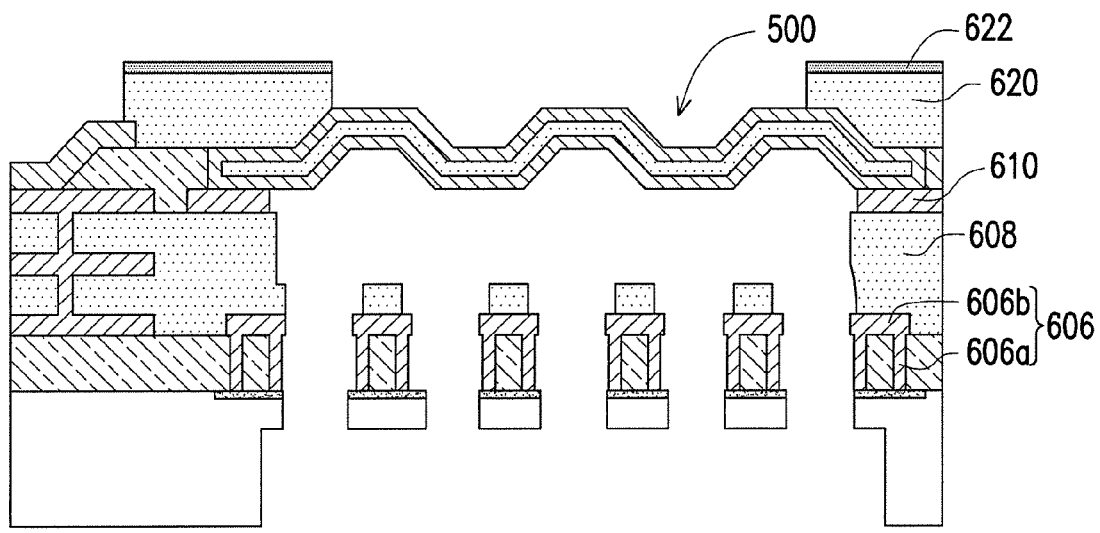

In FIG. 18H, the etching process is continuously performed to completely expose both sides of the diaphragm 500 at the central region, while the end portion of the diaphragm 500 is embedded in the dielectric layer for the use of holding the diaphragm 500.

The sacrificial layer may have higher etching rate or small etching rate, in order to adjust the etching speed of dielectric speed at both sides of the diaphragm 500, as a result, the corrugate conductive layer of the diaphragm can be finally exposed about at the same time without leaving one side for long time in etching process. In addition, the metal silicide 602 on the substrate 600 can reduce the undercut of the venting holes.

In alternative structure of MEMS device, the metal block 606 in FIG. 18H may be omitted, in an option. In other words, the structure being fabricated in process of FIGS. 18A-18E does not include the metal block 606. This also causes the subsequent fabrication process to be certain different although the same concept of using sacrificial layers and the metal silicide layer still remains.

Figure 19A:
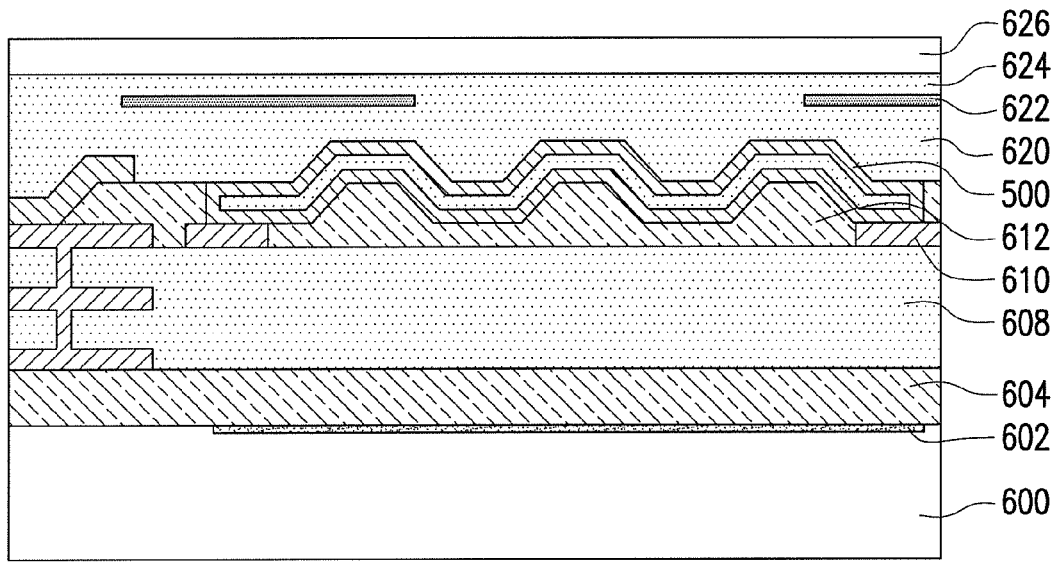
FIGS. 19A-19C are cross-sectional views, schematically illustrating a fabrication process for fabricating a MEMS device, according to an embodiment of the invention.
Figure 19B:
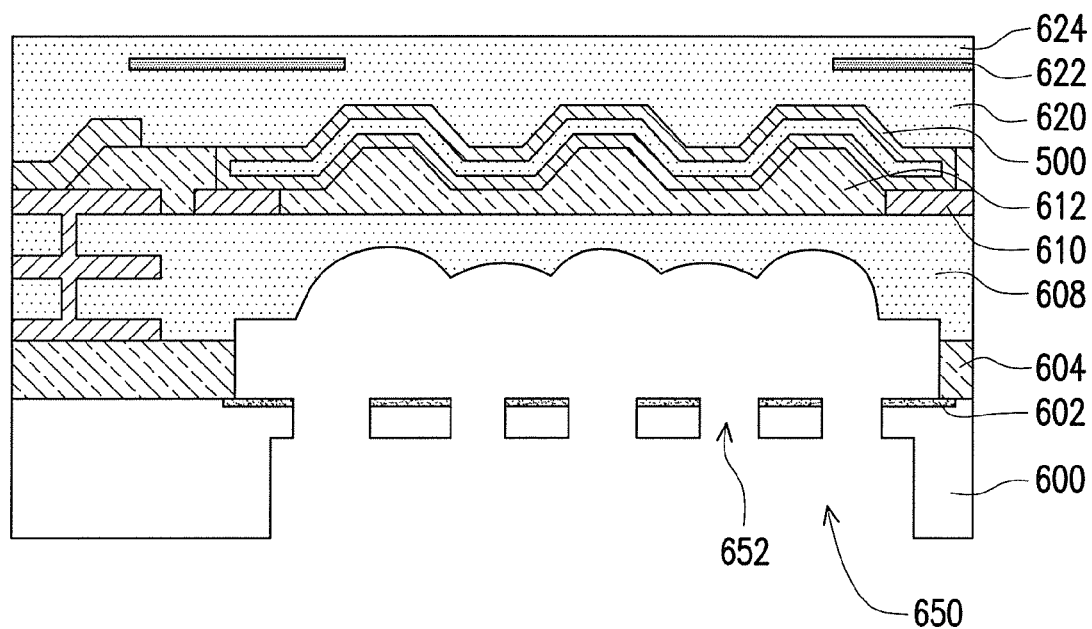
Figure 19C:
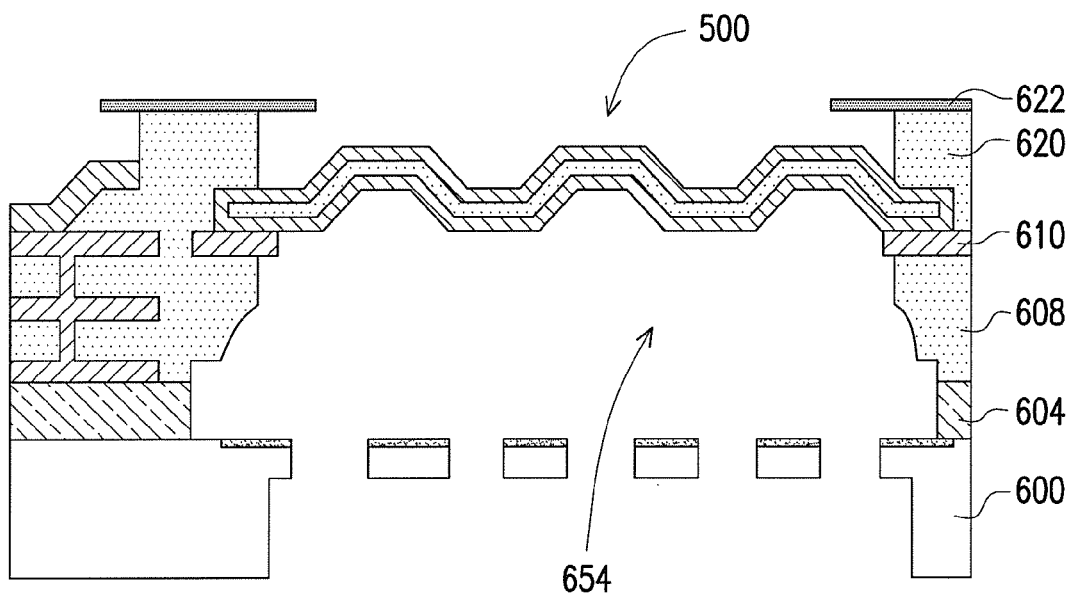

FIGS. 19A-19C are cross-sectional views, schematically illustrating a fabrication process for fabricating a MEMS device, according to an embodiment of the invention. In FIG. 19A, based on the processes in FIGS. 18A-18H, the metal silicide layer 602 is formed on the substrate 600 at the region for forming the MEMS device. The sacrificial dielectric layer 604 is formed over the substrate 600 and the metal silicide layer 602. The structural dielectric layer 608 is formed over the sacrificial dielectric layer 604. Here, there in no metal block 606 in FIG. 18E being formed. The later processes are the same in FIG. 18E, so that the diaphragm 500 is formed and embedded in various dielectric layers while the sacrificial dielectric layers 612 and 626 are also formed.

In FIG. 19B, the substrate 600 is patterned form the backside to form the cavity 650 and venting holes 652 to expose the metal silicide layer 602. The metal silicide layer 602 can prevent the undercut for the venting holes 652 as previously described. Then, an isotropic etching process is performed from both sides over the diaphragm 500. At this stage, the sacrificial layer 626 etched away to expose the dielectric layer 624. On the backside, the exposed metal silicide layer 602 within the venting holes, the sacrificial dielectric layer 604 and the dielectric material of the structural dielectric layer 608 is etched by a large portion, for example, rather close to the sacrificial dielectric layer 612.

In FIG. 19C, the isotropic etching process continuously etches the dielectric material of the structural dielectric layer 608 to expose the central region of the corrugate diaphragm 500. The dielectric portion at the end portion of the diaphragm 500 still remains for supporting the diaphragm 500. The same isotropic etching process also etches dielectric material over the top side of the diaphragm 500 to expose the diaphragm 500. Since the effect of the etching stop layer 624, a portion of the dielectric layer 620 under the etching stop layer 624 still remains under the etching stop layer 622, so as to clamp end portion of the diaphragm 500 from the opposite side to the structural dielectric layer 608. The chamber 654 is then formed, allowing the diaphragm to sense air pressure, for example.

Figure 20A:
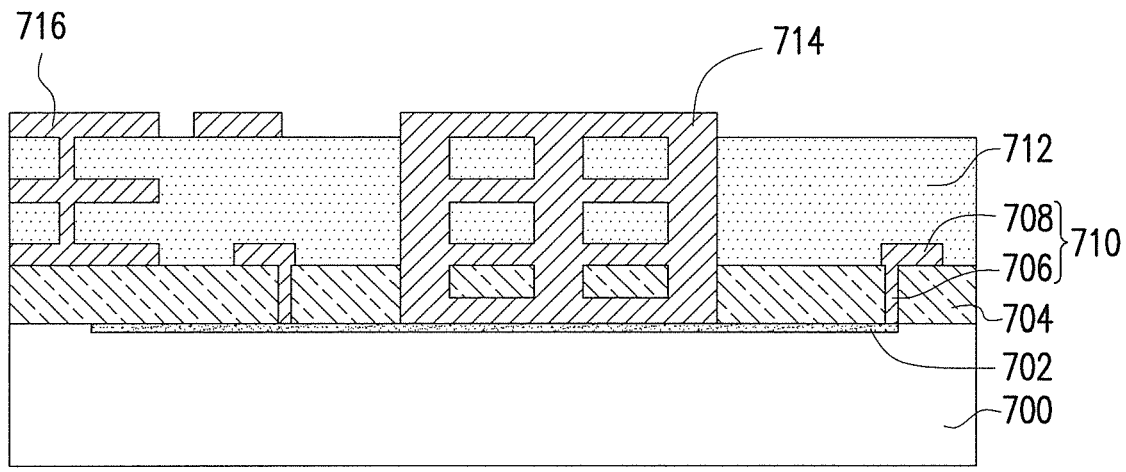
FIGS. 20A-20H are cross-sectional views, schematically illustrating a fabrication process for fabricating a MEMS device, according to an embodiment of the invention.

Alternatively, when the MEMS is in application for sensing acceleration or other but not the air pressure, the corrugate diaphragm is actually serving as the suspension beam with a mass bulk for sensing force. FIGS. 20A-20H are cross-sectional views, schematically illustrating a fabrication process for fabricating a MEMS device, according to an embodiment of the invention. In FIG. 20A, a substrate 700 is provided. A metal silicide layer 702 is formed on the substrate at the region for MEMS device. A sacrificial dielectric layer 704 is formed over the substrate 700 and the metal silicide layer 702. A metal wall 706, i.e. enclosing the MEMS device region, is formed in the sacrificial dielectric layer 704 on the metal silicide layer 702. A metal layer 708 is formed on the sacrificial layer 704 in connection with the metal wall 706. As result, the metal wall 706 and the metal later 708 form an enclosing ring 710 to enclose the MEMS region, in which the geometric shape is not limited to a circle, depending one the actual need. The structural dielectric layer 712 is formed over the sacrificial layer 704. As can be understood, the structural dielectric layer 712 includes the interconnect 716 embedded in the structural dielectric layer for the CMOS device and the mass bulk 714. Several dielectric layers are formed and patterned so as to form the metal mass bulk 714 with dielectric material enclosed. However, the dielectric layers are combined and referred as the structural layer, as previously mentioned. The bottom metal layer of the mass bulk 714 is disposed on the metal silicide layer 702.

Figure 20B:
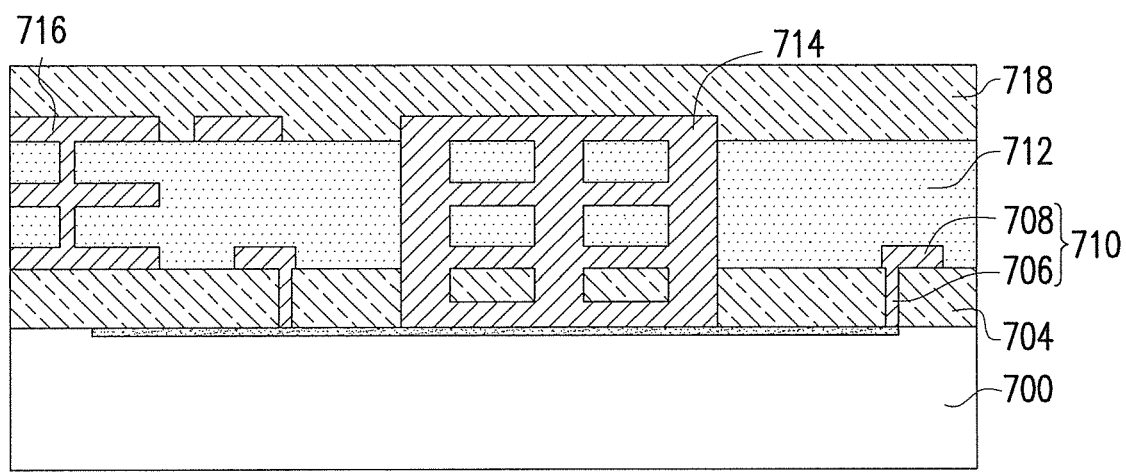
Figure 20C:
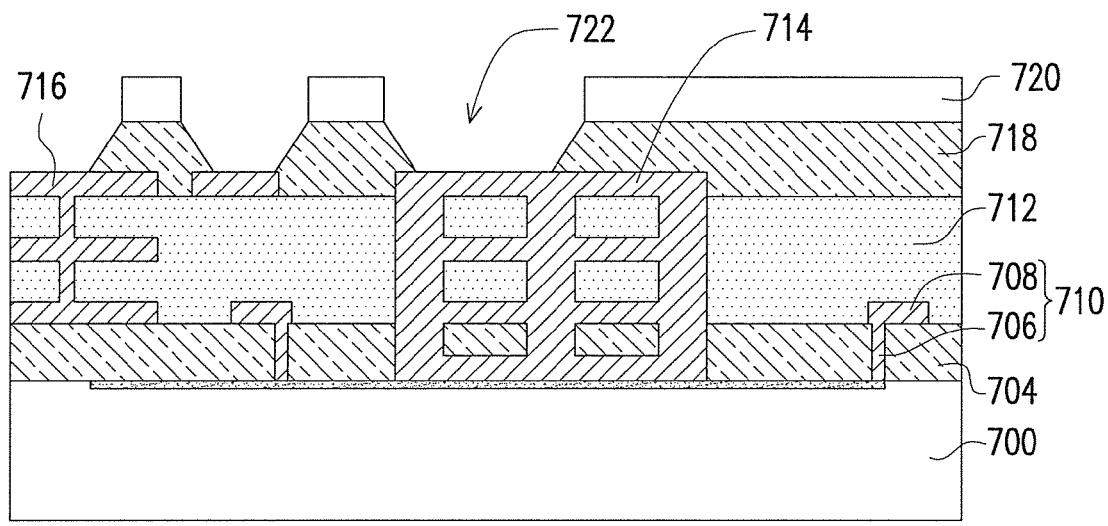

In FIG. 20B, another sacrificial dielectric layer 718 is formed over the structural dielectric layer 712. In FIG. 20C, a photoresist layer 720 with openings is formed on the sacrificial dielectric layer 718. The openings expose a portion of the sacrificial dielectric layer 718. The photoresist layer 720 is used as the etching mask layer, an anisotropic etching process is performed to etch the exposed portion of the sacrificial dielectric layer 718 to form the indents 722 for exposing the mass bulk 714, the top metal slayer for connecting the suspension beam later, and the interconnect metal layer 716. In order to form the corrugate structure for the suspension beam later, the etching energy is not strong, so that the side wall of the indents 722 is slant.

Figure 20D:
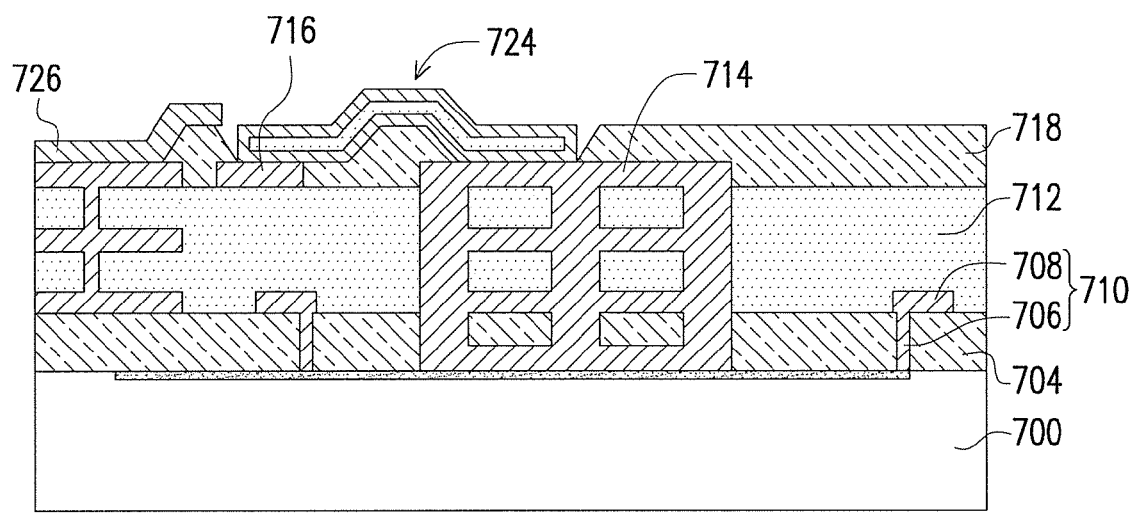
Figure 20E:
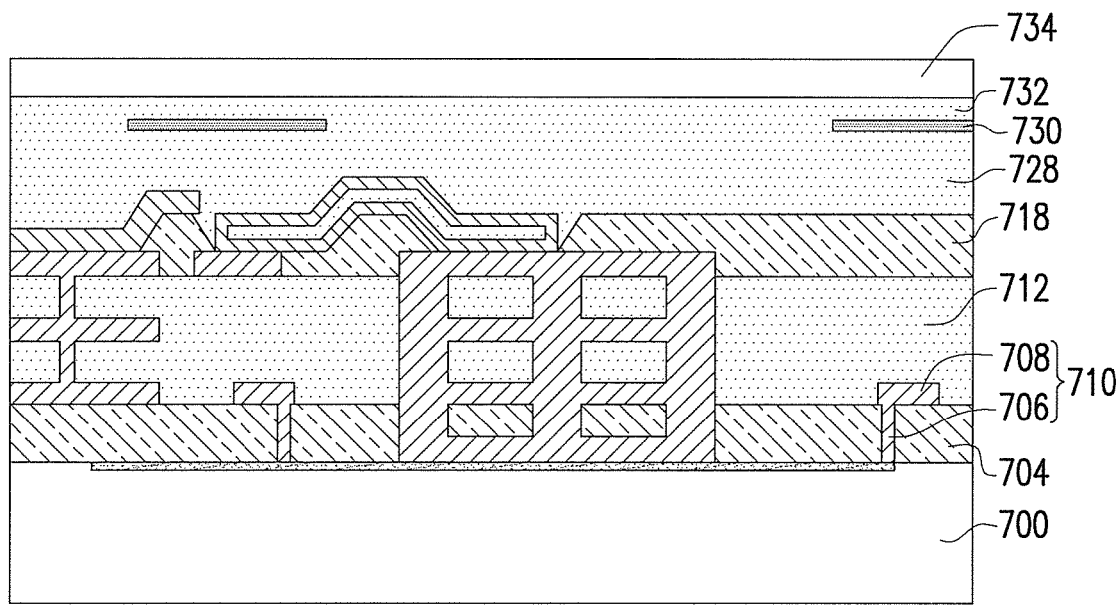

In FIG. 20D, the photoresist layer 720 is stripped away. A corrugate suspension beam 724 is formed on the indent 722 in conformal shape. The suspension beam 724 is like the diaphragm but just one end portion is to be fixed while the other end in connection with the mass bulk 714 is to be suspension. Also and the bonding pad 726, for example, is formed in connection with the interconnect 716. In FIG. 20E, another structural dielectric layer including the lower dielectric layer 728, the etching stop layer 730 and the upper dielectric layer 732 is formed over the sacrificial layer 718 and the suspension beam 724. A sacrificial layer 734 is formed over the dielectric layer 732.

Figure 20F:
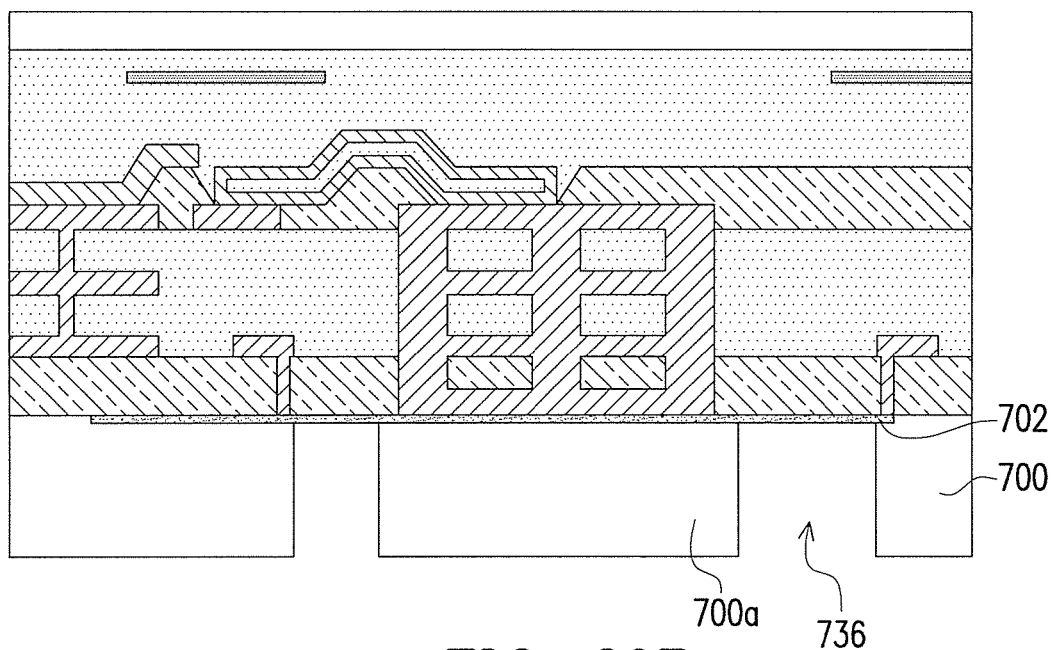

In FIG. 20F, the substrate 700 is patterned to have the enclosing trench 736 to expose the metal silicide layer 702, in which the substrate portion 700a surrounded by the trench 736 is an isolation portion in mechanically fixed with the mass bulk 714.

Figure 20G:
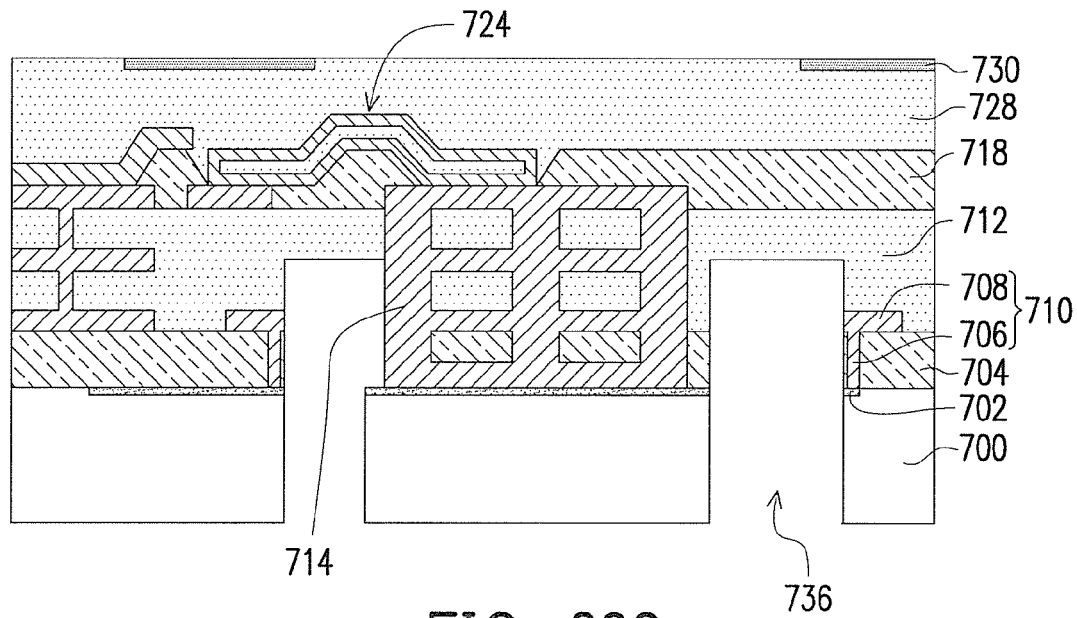

In FIG. 20G, an isotropic etching process is performed over the both sides of the suspension beam 724. As a result at the backside, the metal silicide layer 720, the sacrificial layer 704 and the dielectric material of the structural dielectric layer 712 are etched via the trench 736. At the same time, the same isotropic etching process is etching over the top side of the suspension beam 724, so that the sacrificial dielectric layer 734 and the dielectric layer 732 are removed to expose the etching stop layer 730. Due to the ring wall 706 in the sacrificial layer 704, the end portion of the sacrificial layer 704 is not etched and therefore can server as the supporting structure. Due to the effect of the sacrificial layer 734, a sufficient portion of the dielectric layer 728 still remains in order to be balance to the amount of the dielectric under the suspension beam 724.

Figure 20H:
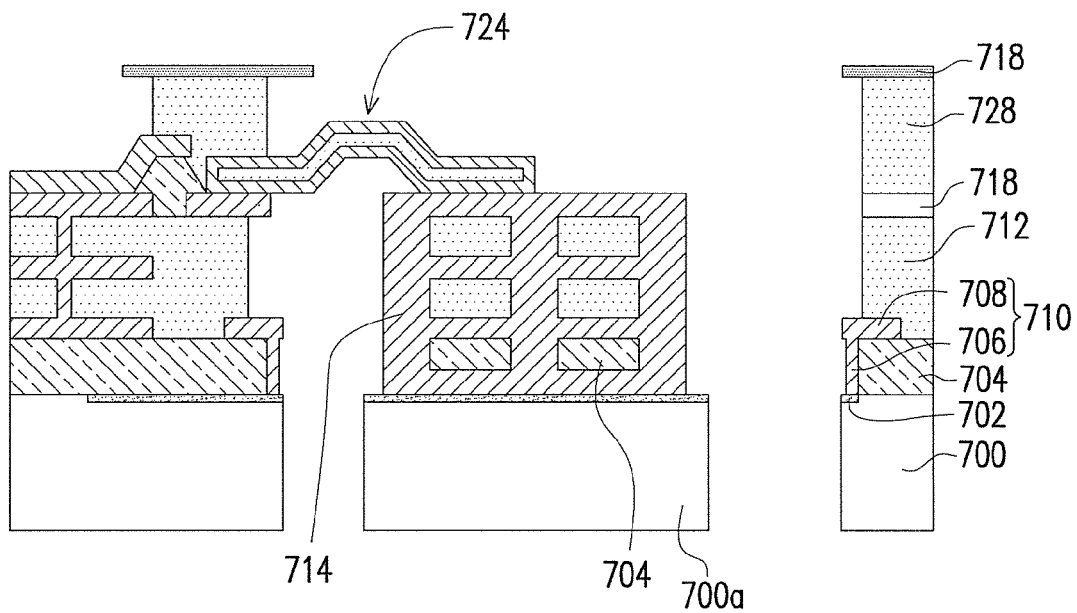

In FIG. 20H, the same isotropic etching process is continuously performed to expose the mass bulk 714 and the suspension beam 724 at both sides, in which the mass bulk 714 further includes the isolated substrate portion 700a in other words. The etching stop layer 730 protects a portion of the dielectric layer 728 and the sacrificial dielectric layer at the end portion to serve as the supporting structure. As a result, one end of the suspension beam is inserted in the structural dielectric layer in general for supporting the suspension beam 714 while the other end with the mass bulk 714 integrated with the isolated substrate portion 700a is suspension for sensing force due to acceleration speed for shifting the mass bulk 714 accordingly.

Again, the sacrificial layers can be used to adjust the etching rate, so as to control the etching process to have about the same time to expose the suspension beam 714 without damaging the structure because one side of the exposed portion of the suspension beam is contacting with the liquid etchant for long time without balance in etching speed. The metal silicide can also prevent the undercut when etching the substrate 700.

Figure 2:
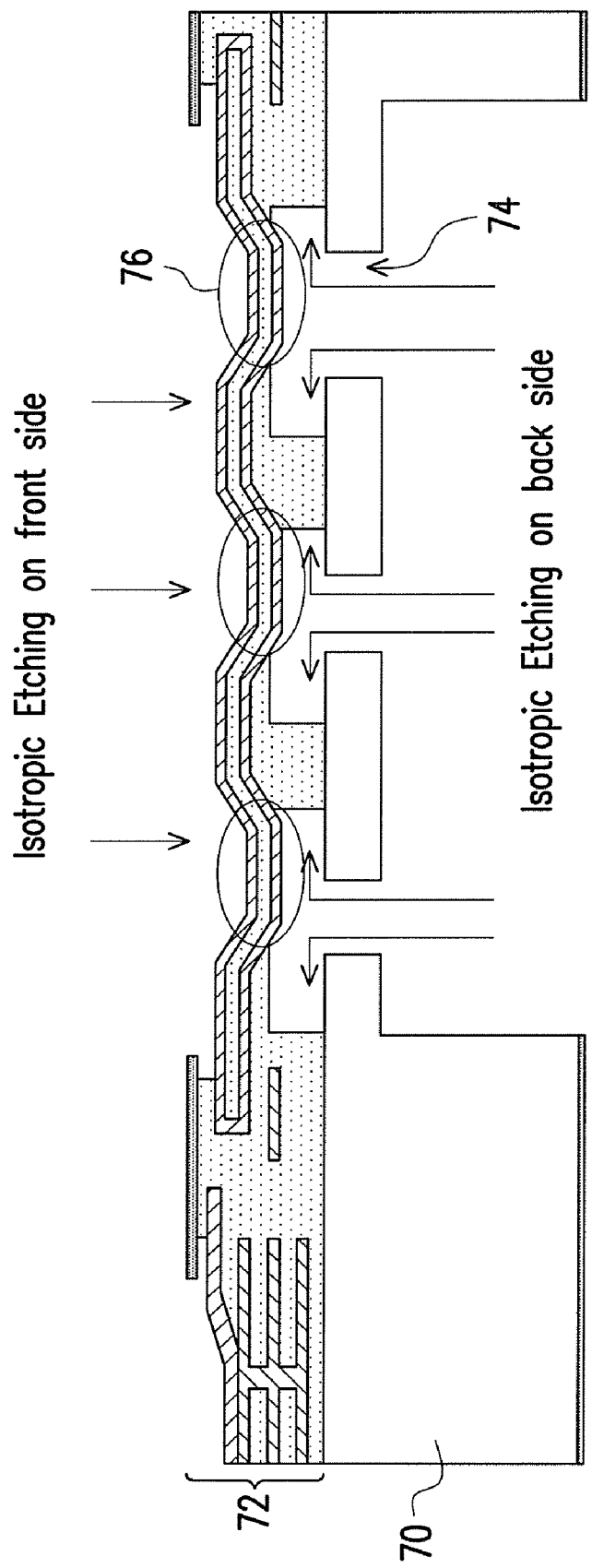
FIG. 2 is a cross-sectional view, schematically illustrating the process to etch the dielectric of the MEMS device for exposing the diaphragm.
Figure 21:
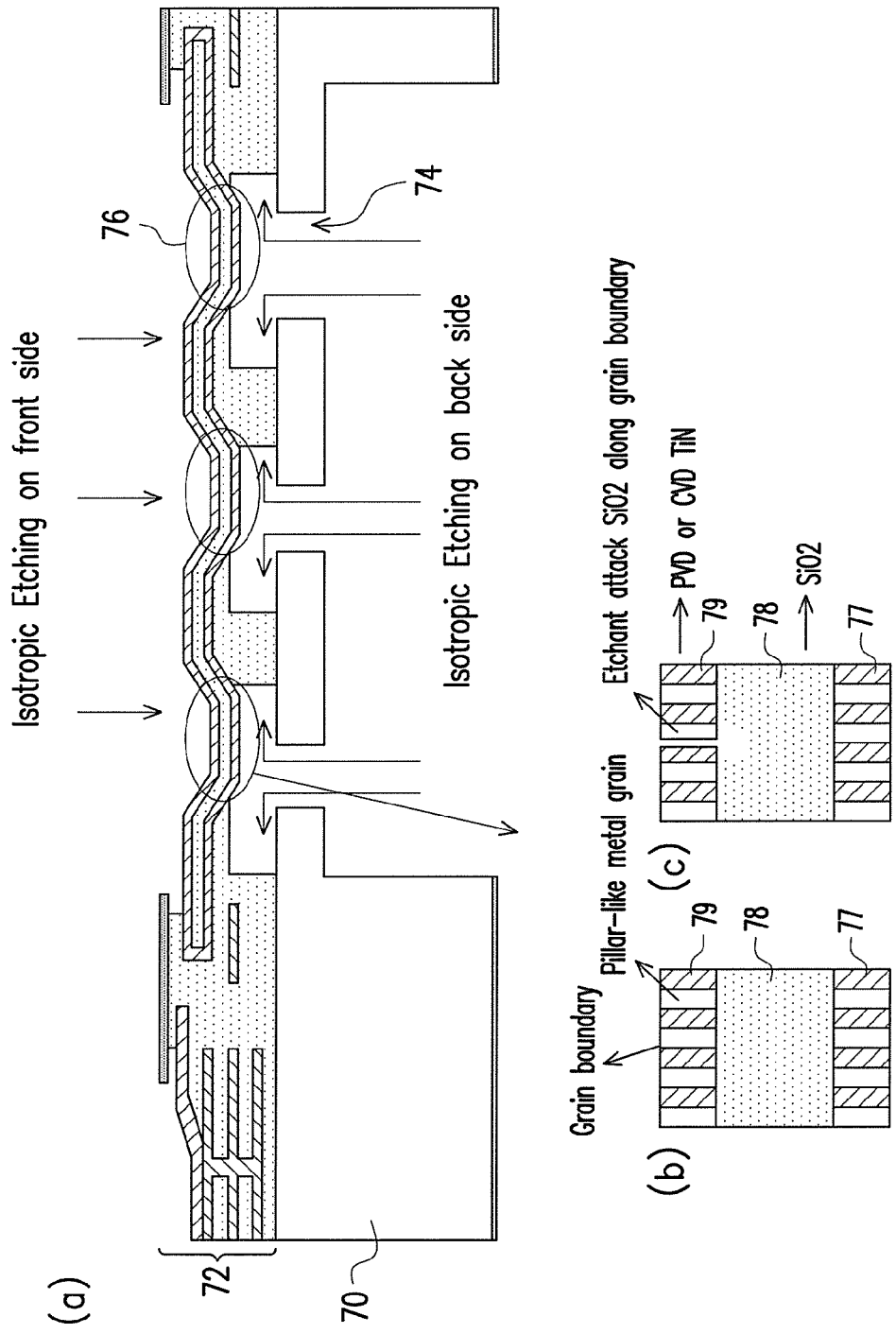
FIG. 21 is a cross-sectional view, schematically illustrating a conventional issue of the diaphragm under etching considered by the present invention.

In further considering the conductive layer of the diaphragm to resist the long-time etching process, the present invention discussed the conventional issue and proposes a solution. FIG. 21 is a cross-sectional view, schematically illustrating a conventional issue of the diaphragm under etching considered by the present invention. Likewise in FIG. 2, in FIG. 21(a), the metal layer of the diaphragm at the region 76 is exposed being much earlier than the other parts and would be stay for a long time under etchant. The metal layer of the diaphragm is attacked easily by the etchant. In more detail as shown in FIG. 21(b), metal layers 77 and 79, e.g. TiN which is exposed to etchant, are usually formed by the structure of pillar-like grain with the grain boundary perpendicular to the surface of a diaphragm. In FIG. 21(b), the etchant is easy to penetrate the metal layer 77, 79 along the grain boundary into the dielectric 78, such as silicon oxide, of a diaphragm and damage the diaphragm.

Figure 22:
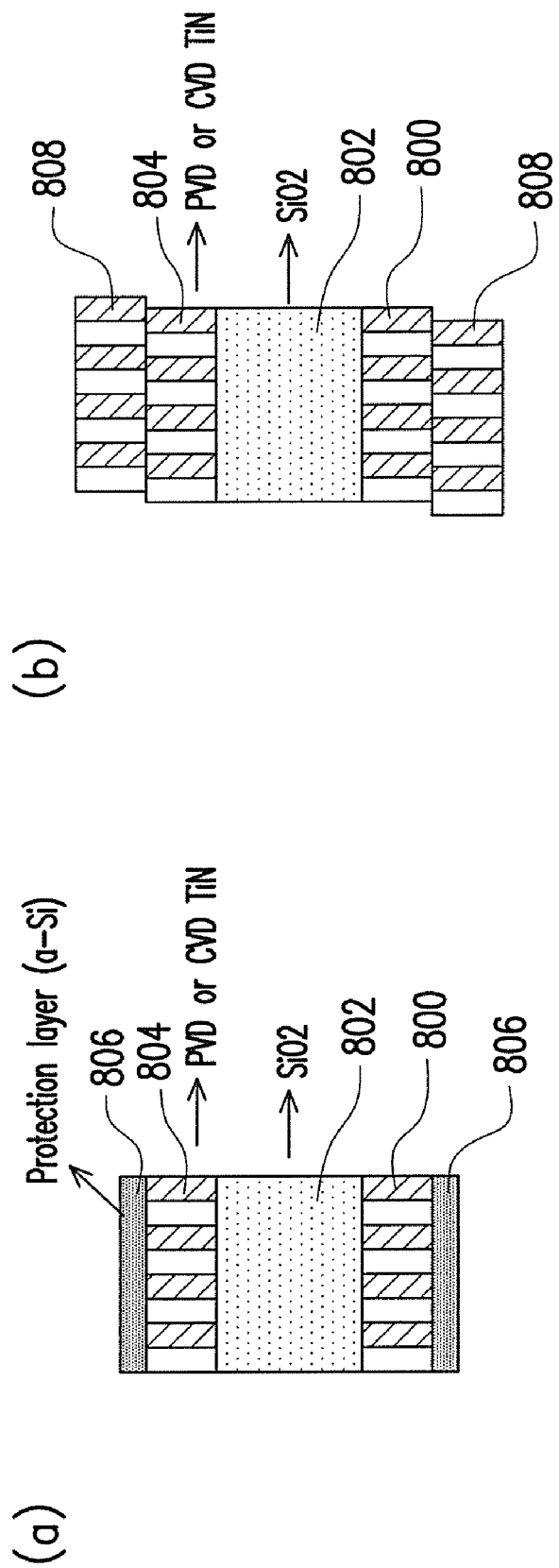
FIG. 22 is a cross-sectional view, schematically illustrating a structure of the diaphragm, according to an embodiment of the present invention.

FIG. 22 is a cross-sectional view, schematically illustrating a structure of the diaphragm, according to an embodiment of the present invention. In FIG. 22 (a), the metal layer of the diaphragm can be multi-layer with additional amorphous silicon (a-Si) or polysilicon layer 806, serving as a protection layer. For example, the protection layer is formed on the metal layers 800 and 804 while the metal layers 800 and 804 enclose the dielectric layer 802. However, the protection layer can also be directly formed on the dielectric layer 802 in another example. The metal layers 800 and 804 can be deposited by. For example, physical vapor deposition (PVD), chemical vapor deposition (CVD) or sputtering deposition.

In FIG. 22(b), alternatively, the protection layer 808 can be the same metal material as the metal layers 800 and 804, but is deposited in two stages as two layers. Usually, when the protection layer 808 in the same or different material from the metal layer 800 and 804 is separately formed on the metal layers 800 and 804, the grain boundary will be broken at the interface because the two deposition process has very low probability to have the grain boundaries being aligned together. As a result, even if the protection layer 808 is attacked by the etchant, the grain boundary of the under metal layers 800 and 804 are not significantly exposed and can still resist the etchant.

Figure 23A:
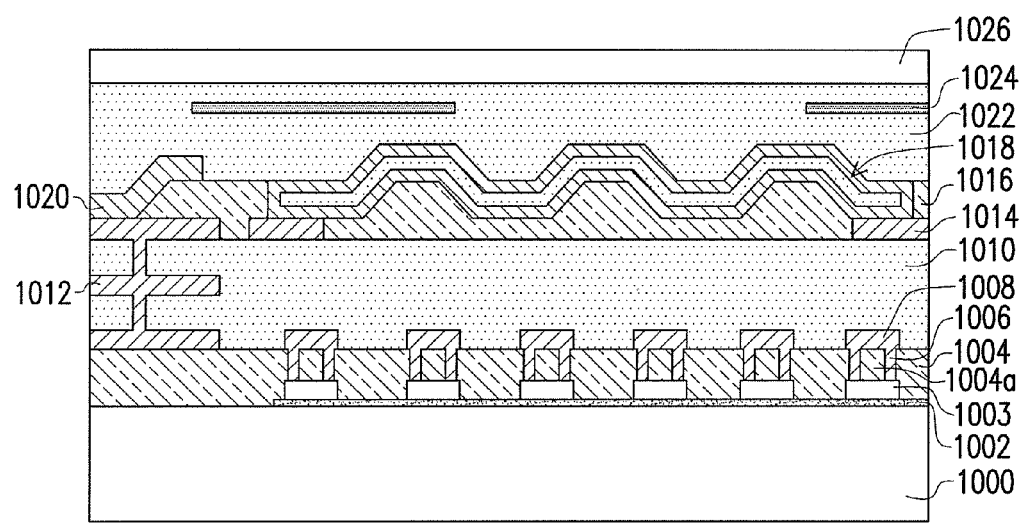
FIGS. 23A-23D are cross-sectional views, schematically illustrating another fabrication process for a structure of MEMS device, according to another embodiment of the invention.

FIGS. 23A-23D are cross-sectional views, schematically illustrating another fabrication process for a structure of MEMS device, according to another embodiment of the invention. In FIG. 23A, a substrate 1000, such as silicon substrate, is provided as the back plate. A metal silicide layer 1002 is formed on the silicon substrate 1000 at the MEMS region. A conductive layer 1003 in a pattern is formed on the metal silicide layer 1002 with a portion of the metal silicide layer 1002, corresponding to venting holes later, is exposed. The conductive layer 1003 can be metal or polysilicon, for example. A sacrificial dielectric layer 1004 is formed over the substrate 1000, in which the metal silicide layer 1002 and the conductive layer 1003 are covered as well. The sacrificial dielectric layer 1004 is patterned to have conductive walls 1006 on the conductive layer 1003. A portion 1004a of the sacrificial dielectric layer 1004 is enclosed by the conductive walls 1006 above the conductive layer 1003. A top conductive layer 1008 is formed on the sacrificial dielectric layer 1004 to cover the portion 1004a of the sacrificial dielectric layer 1004, so that the dielectric blocks enclosed by the conductive layers are formed. Here, the dielectric blocks are actually forming together as a back plate with the venting holes therein. The sidewalls of the venting holes are covered by the conductive walls 1004. Then, the structural dielectric layer 1010 is formed over the sacrificial dielectric layer 1004. The structural dielectric layer 1010 includes embedded interconnect structure 1012 and the conductive layer 1014 at the MEMS region on the structural dielectric layer 1010.

Another sacrificial dielectric layer 1016 is formed over the structural dielectric layer 1010. A corrugate diaphragm 1018 is formed on the sacrificial dielectric layer 1016, as previous described. The conductive pad 1020 at the CMOS region can be also formed over a portion of the sacrificial dielectric layer 1016 and in electric connection with the embedded interconnect structure 1012. Another structural dielectric layer 1022 is formed over the corrugate diaphragm 1018. The structural dielectric layer 1022 has the embedded etching stop layer 1024, which surrounds a periphery of the MEMS region, and cover over the periphery of the corrugate diaphragm 1018. Another sacrificial dielectric layer 1026 is formed on the structural dielectric layer 1022. In the three sacrificial dielectric layers 1004, 1016 and 1026, in order to adjust the etching rate with respect to the diaphragm, materials for the sacrificial dielectric layers 1004 and 1016 can be high etching rate but material for the sacrificial dielectric layer 1026 is low etching rate.

Figure 23B:
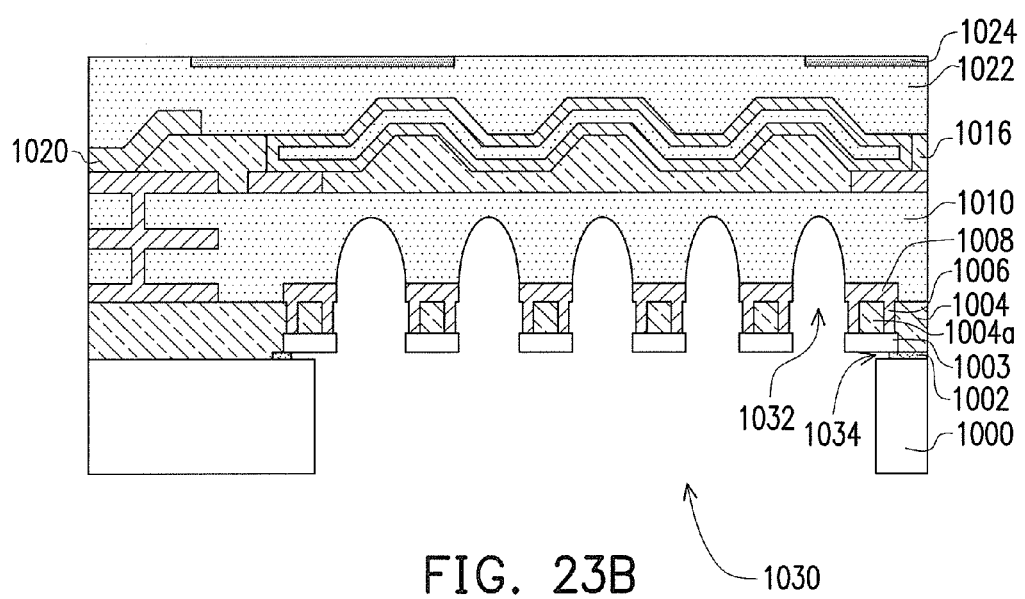

In FIG. 23B, the substrate 1000 and the metal silicide layer 1002 are patterned to have a cavity 1030 to expose the conductive layer 1003 and the sacrificial layer 1004. Since the metal silicide layer 1002 has been etched to expose the conductive layer 1003 and leave a gap 1034, not on the substrate 1000. In this embodiment, the substrate 1000 needs not to be patterned with the venting holes, which are needed in other embodiments. Then, an isotropic etching process, such as wet etching process, is performed from both sides with respect to the corrugate diaphragm 1018. As a result, in the beginning stage, the dielectric portion of the structural dielectric layer 1010 is etched but the portion 1004a of the sacrificial dielectric layer 1004 still remains due to the conductive layer 1003 and the conductive wall 1006. In other word, the venting holes 1032 are formed between the dielectric blocks. The etching process continuously etches the dielectric portion of the structural dielectric layer 1010. At the same time, the sacrificial layer 1026 above the diaphragm 1018 is etched and a top dielectric portion are etched to expose the etching stop layer 1024. Since the sacrificial layer 1026 is in low etching rate, the dielectric material in the structural dielectric layer 1010 is etched more.

Figure 23C:
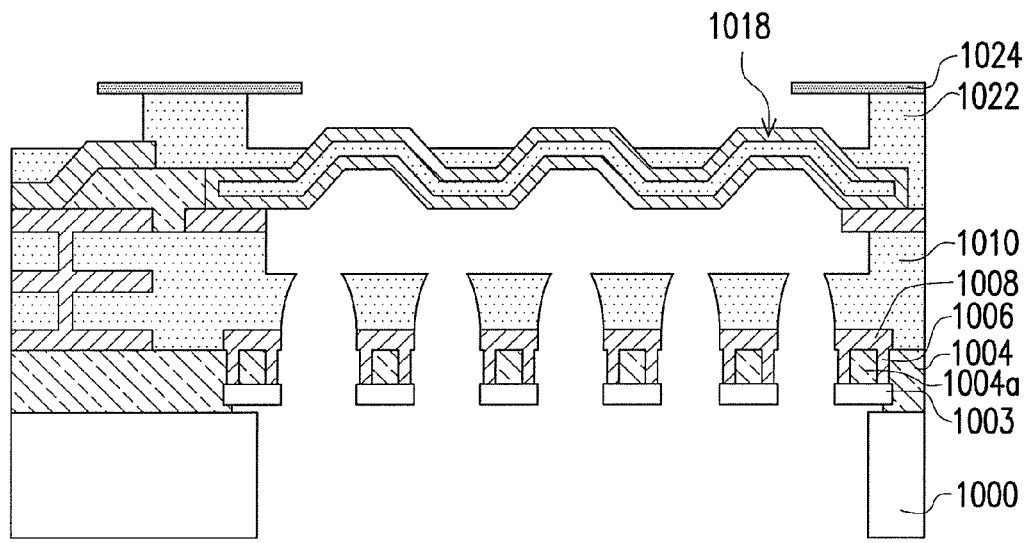

In FIG. 23C, the etching process continues. Then, the back side of the corrugate diaphragm 1018 is exposed while there is still a portion of the dielectric material remaining on the conductive layer 1008. The other side of the corrugate diaphragm 1018 is also almost exposed with a remaining little portion of the dielectric material of the structural dielectric layer 1022. Since the etching stop layer 1024, the dielectric portion of the structural dielectric layer 1022 under the etching stop layer still remains to hold the periphery of the corrugated diaphragm 1018 and also protects the region between the CMOS region and the MEMS region.

Figure 23D:
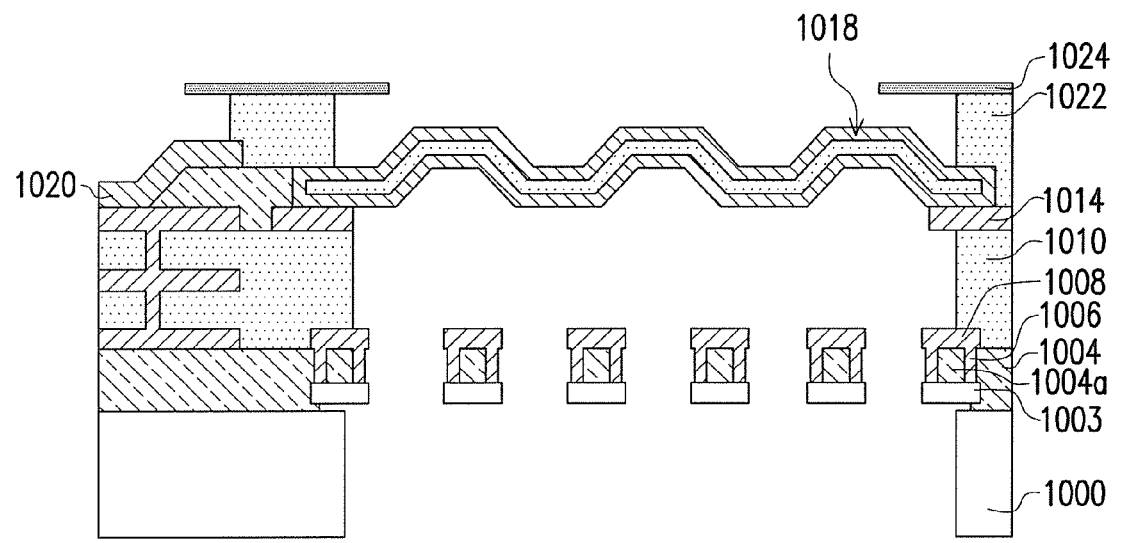

In FIG. 23D, after the etching process finishes, the central region of the corrugated diaphragm 1018 is fully exposed. In addition, the residual dielectric portions are also etched. As a result, the corrugate diaphragm 1018 of the MEMS device can be formed. In this embodiment, due to the dielectric blocks also includes the conductive layer 1003 at bottom, the substrate 1000 need no the venting holes. The actual venting holes are the holes between the dielectric blocks, which includes the conductive layer 1003, the conductive walls 1006 and the top meal layer 1008.

Figure 24:
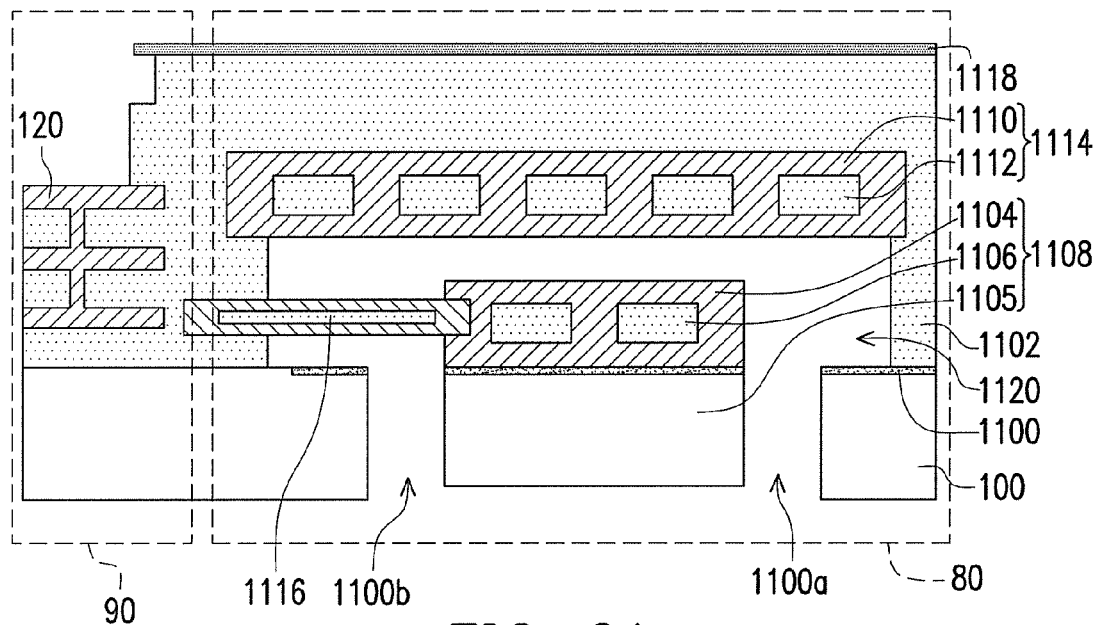
FIG. 24 is a cross-sectional view, schematically illustrating a structure of MEMS system for accelerator, according to an embodiment of the present invention.

FIG. 24 is a cross-sectional view, schematically illustrating a structure of MEMS system for accelerator, according to an embodiment of the present invention. In FIG. 24, a substrate 100 is provided in which a CMOS circuit region 90 and a MEMS device region 80 are set. A metal silicide layer 1100 is formed on the substrate 100 at the MEMS device region 80. A structural dielectric layer 1102 is formed over the substrate 100. The structural dielectric layer includes a circuit in the CMOS circuit region 90 and the MEMS device at the MEMS device region 80. The MEMS device includes a mass bulk 1108 on the metal silicide layer 1100, a suspension beam 1116 joins the mass bulk 1108 at one end while the other end to be held in the final product. The mass bulk 1108 can include metal layers 1104 to enclose dielectric blocks 1106. In addition, a substrate portion 1105 of the substrate 100 can also be included as a part of the mass bulk 1108. The mass bulk 1108 can be used in accelerator for sensing the acceleration. The suspension beam 1116 can include, for example, a conductive layer with dielectric therein, as previously described. However, the suspension beam 1116 can be corrugated or not corrugated to serve as a spring for holding the mass bulk 1108. In this example, the suspension beam 1116 is shown without corrugation.

Further, the structural dielectric layer 1102 can further include other embedded structure 1114, which can, for example, have the metal layers 1110 to enclose dielectric blocks 1112. In this example, the embedded structure 1114 can extend over the MEMS device region 80. Then a hard mask layer 1118 can be formed to cover over the structural dielectric layer 1102 at the MEMS device region 80, to serve an etching mask. In addition, if it is necessary, another dielectric layer can be formed over the hard mask layer 1118 to protect the isotropic etching process performed later.

Then, the substrate 100 is patterned from the back side to form a venting hole 1100a at one side of the mask block 1108 and a venting hole 1100b at the other side of the mask block 1108, corresponding to the suspension beam 1116, to expose the dielectric portion of the structural dielectric layer 1102. Here, the substrate portion 1105 is at the bottom of the mass bulk 1108 and can be reduced in thickness for obtaining the desired weighting level for sensing the acceleration.

Further, an isotropic etching process is performed from the venting holes 1100a and 1100b and a portion of dielectric material of the structural dielectric layer 1102 is etched to expose the suspension beam 1116, the mass bulk 1108, and the embedded structure 1114. One end of the suspension beam 1116 holds the mass bulk 1108 and the other end is held by the structural dielectric layer 1102. As a result, the suspension beam 1116 holds the mass bulk 1108 within the chamber 1120, which expose the mass bulk 1108 and the suspension beam 1116. The metal layers 1104 and 1110 serve at least a capacitor for sensing the acceleration. In addition, due to the protection of the hard mask layer 1118, the structural dielectric layer 1102 under the hard mask layer 1118 can be reserved.

Figure 25:
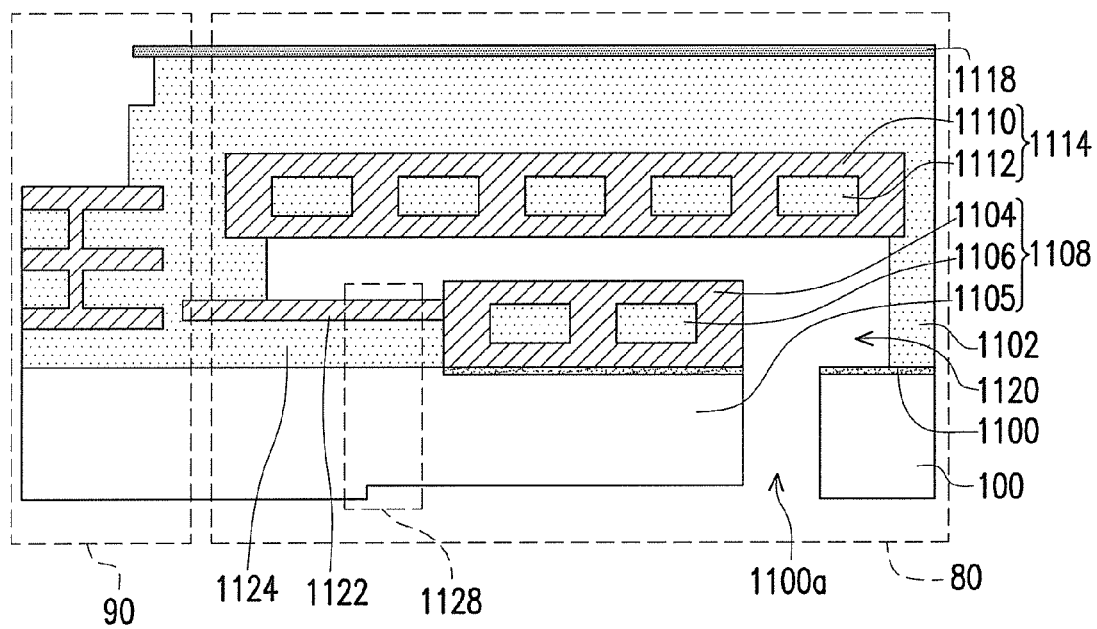
FIG. 25 is a cross-sectional view, schematically illustrating a structure of MEMS system for accelerator, according to another embodiment of the present invention.

FIG. 25 is a cross-sectional view, schematically illustrating a structure of MEMS system for accelerator, according to an embodiment of the present invention. In FIG. 25, like FIG. 24, a substrate 100 is provided in which a CMOS circuit region 90 and a MEMS device region 80 are set. A metal silicide layer 1100 is formed on the substrate 100 at the MEMS device region 80. A structural dielectric layer 1102 is formed over the substrate 100. The structural dielectric layer includes a circuit in the CMOS circuit region 90 and the MEMS device at the MEMS device region 80. The MEMS device includes a mass bulk 1108 on the metal silicide layer 1100.

In this embodiment, the suspension beam is acted as a moveable spring. A metal layer 1122 is also embedded in the structural dielectric layer for connecting with the metal layer 1104. The dielectric portion 1124 and a portion of the substrate 100 under the metal layer 1122 serves together as the suspension beam 1128.

Further, the structural dielectric layer 1102 can further include other embedded structure 1114, which can, for example, have the metal layers 1110 to enclose dielectric blocks 1112. In this example, the embedded structure 1114 can extend over the MEMS device region 80. Then a hard mask layer 1118 can be formed to cover over the structural dielectric layer 1102 at the MEMS device region 80, to serve an etching mask. In addition, if it is necessary, another dielectric layer can be formed over the hard mask layer 1118 to protect the isotropic etching process performed later.

Then, the substrate 100 is patterned from the back side to form a venting hole 1100a at one side of the mask block 1108 to expose the dielectric portion of the structural dielectric layer 1102. Here, the substrate portion 1105 is at the bottom of the mass bulk 1108 and can be reduced in thickness for obtaining the desired weighting level for sensing the acceleration.

Further, an isotropic etching process is performed from the venting hole 1100a and a portion of dielectric material of the structural dielectric layer 1102 between the mass bulk 1108 and the embedded structure 1114 is etched to expose the mass bulk 1108 and the embedded structure 1114. Here, since the metal layer 1122 and the dielectric portion 1124 with a portion of the substrate are not etched, they together serve as the suspension beam 1128 to hold the mass bulk 1108 within the chamber 1120, which exposes the mass bulk 1108 and the metal layer 1122. The dielectric layer 1124 under the metal layer 1122 still remains during the etching process. The metal layer 1104 and the lower layer of the metal layer 1110 serve at least a capacitor for sensing the acceleration. In addition, due to the protection of the hard mask layer 1118, the structural dielectric layer 1102 under the hard mask layer 1118 can be reserved.

Generally, the example in FIG. 25 uses a part of the silicon 100 as the suspension beam for the mass bulk. The suspension beam 1128 in this example can be also referred as the silicon suspension beam. The metal layer 1122 actually also has the effect to resist isotropic etching process for the dielectric material.

It will be apparent to those skilled in the art that various modifications and variations can be made to the structure of the present invention without departing from the scope or spirit of the invention. In view of the foregoing descriptions, it is intended that the present invention covers modifications and variations of this invention if they fall within the scope of the following claims and their equivalents.

What is claimed is:
1. A method for fabricating a microelectromechanical system (MEMS) device, comprising:
 providing a substrate, having a first side and a second side, wherein a metal silicide is formed on the substrate at the first side, covering a MEMS region of the substrate;
 forming a structural dielectric layer over the substrate at a first side, wherein a diaphragm is embedded in the structural dielectric layer;
 patterning the substrate from the second side to form a plurality of perforating openings in the substrate corresponding to the diaphragm, wherein the metal silicide is exposed by the perforating openings in the substrate; and
 performing an isotropic etching process from the first side and the second side of the substrate via the perforating openings to remove a dielectric portion of the structural dielectric layer for exposing a central portion of the diaphragm while an end of portion is held by a residue portion of the structural dielectric layer.

2. The method of claim 1, wherein in the step of performing the isotropic etching process from the first side and the second side of the substrate via the perforating openings, the exposed metal silicide is etched during the isotropic etching process.

3. The method of claim 1, wherein in the step of forming the structural dielectric layer over the substrate at a first side, the structural dielectric layer includes a CMOS circuit outside the diaphragm.

4. The method of claim 1, wherein the step of forming the structural dielectric layer comprises forming a plurality of the metal block on the substrate at the first side for surrounding the perforating openings, wherein the metal block comprises an outer metal layer and an inner dielectric block covered by the outer metal layer.

5. The method of claim 4, wherein in the step of performing the isotropic etching process, a side portion of the metal block is also exposed.

6. A method for fabricating a microelectromechanical system (MEMS) device, comprising:
 providing a substrate, having a first side and a second side;
 forming a structural dielectric layer over the substrate at a first side, wherein a diaphragm is embedded in the structural dielectric layer;
 patterning the substrate from the second side to form a plurality of perforating openings in the substrate corresponding to the diaphragm; and
 performing an isotropic etching process from the first side and the second side of the substrate via the perforating openings to remove a dielectric portion of the structural dielectric layer for exposing a central portion of the diaphragm while an end portion is held by a residue portion of the structural dielectric layer,
 wherein the structural dielectric layer comprises a structural sacrificial dielectric layer, and the step of forming the structural dielectric layer comprises:
 forming at least a structural sacrificial dielectric layer over the substrate; and
 forming the diaphragm over the first layer
 wherein the structural sacrificial dielectric layer is larger in etching rate than the structural dielectric layer outside of the sacrificial layer.

7. The method of claim 6, wherein the step of forming the structural dielectric layer further comprise forming a top sacrificial dielectric layer formed over the diaphragm, wherein the top sacrificial dielectric layer is slower in etching rate than the structural dielectric layer outside of the sacrificial layer.

8. A method for fabricating a microelectromechanical system (MEMS) device, comprising:
 providing a substrate, having a first side and a second side;
 forming a structural dielectric layer over the substrate at a first side, wherein a diaphragm is embedded in the structural dielectric layer;
 patterning the substrate from the second side to form a plurality of perforating openings in the substrate corresponding to the diaphragm; and performing an isotropic etching process from the first side and the second side of the substrate via the perforating openings to remove a dielectric portion of the structural dielectric layer for exposing a central portion of the diaphragm while an end portion is held by a residue portion of the structural dielectric layer, wherein the structural dielectric layer comprises a structural sacrificial dielectric layer wrapping the diaphragm opposite to the substrate and the structural sacrificial dielectric layer is larger in etching rate than the structural dielectric layer outside of the structural sacrificial layer.

9. The method of claim 8, wherein the structural dielectric layer comprises a structural sacrificial dielectric layer and a top sacrificial dielectric layer, and the step of forming the structural dielectric layer comprises:

forming the structural sacrificial dielectric layer over the substrate, and wrapping the diaphragm; and forming the top sacrificial dielectric layer over the structural sacrificial dielectric layer, wherein the structural sacrificial dielectric layer is larger in etching rate than the structural dielectric layer outside of the sacrificial layer, and top sacrificial dielectric layer is slower in etching rate than the structural dielectric layer outside of the sacrificial layer.

10. The method of claim 8, wherein the step of forming the structural dielectric layer further comprise forming a top sacrificial dielectric layer over the diaphragm, wherein the top sacrificial dielectric layer is slower in etching rate than the structural dielectric layer outside of the sacrificial layer.

11. The method of claim 8, wherein the structural sacrificial dielectric layer is larger in etching rate than the structural dielectric layer outside of the sacrificial layer, and a part of the structure dielectric layer on the substrate under the structural sacrificial dielectric layer remains between the perforating openings after performing the isotropic etching process.

12. A method for fabricating a microelectromechanical system (MEMS) device, comprising:

providing a substrate, having a first side and a second side;

forming a structural dielectric layer over the substrate at the first side, wherein a diaphragm and a plurality of dielectric blocks enclosed by conductive layers are embedded in the structural dielectric layer, wherein the dielectric blocks form a back plate, and a reserved dielectric portion is between the dielectric blocks;

patterning the substrate from the second side to form a cavity in corresponding to the diaphragm and to expose the structural dielectric layer; and performing an isotropic etching process from the first side and the second side of the substrate via the cavity to remove a dielectric portion of the structural dielectric layer for exposing a central portion of the diaphragm and the back plate while an end portion of the diaphragm and the back plate are held by a residue portion of the structural dielectric layer, wherein the reserved dielectric portion between the dielectric blocks is etched to form multiple venting holes, the venting holes expose a conductive wall of the dielectric blocks of the back plate, and a dielectric portion of the structural dielectric layer is removed via the venting holes for exposing the central portion of the diaphragm and back plate.

13. A method for fabricating a microelectromechanical system (MEMS) device, comprising:

providing a substrate, having a first side and a second side;

forming a structural dielectric layer over the substrate at the first side, wherein a diaphragm and a plurality of dielectric blocks enclosed by conductive layers are embedded in the structural dielectric layer, wherein the dielectric blocks form a back plate, and a reserved dielectric portion is between the dielectric blocks;

patterning the substrate from the second side to form a cavity in corresponding to the diaphragm and to expose the structural dielectric layer; and performing an isotropic etching process from the first side and the second side of the substrate via the cavity to remove a dielectric portion of the structural dielectric layer for exposing a central portion of the diaphragm and the back plate while an end portion of the diaphragm and the back plate are held by a residue portion of the structural dielectric layer, wherein the structural dielectric layer comprises a structural sacrificial dielectric layer wrapping the diaphragm opposite to the back plate and the structural sacrificial dielectric layer is larger in etching rate than the structural dielectric layer outside of the structural sacrificial layer.

14. The method of claim 13, wherein the step of forming the structural dielectric layer further comprise forming a top sacrificial dielectric layer over the diaphragm, wherein the top sacrificial dielectric layer is slower in etching rate than the structural dielectric layer outside of the sacrificial layer.

15. The method of claim 13, wherein the structural sacrificial dielectric layer is larger in etching rate than the structural dielectric layer outside of the sacrificial layer, and a part of the structure dielectric layer on the substrate under the structural sacrificial dielectric layer remains on the back plate facing the diaphragm after performing the isotropic etching process.

16. A method for fabricating a microelectromechanical system (MEMS) device, comprising:

providing a substrate, having a first side and a second side;

forming a structural dielectric layer over the substrate at the first side, wherein a diaphragm and a plurality of dielectric blocks enclosed by conductive layers are embedded in the structural dielectric layer, wherein the dielectric blocks form a back plate, and a reserved dielectric portion is between the dielectric blocks;

patterning the substrate from the second side to form a cavity in corresponding to the diaphragm and to expose the structural dielectric layer: and performing an isotropic etching process from the first side and the second side of the substrate via the cavity to remove a dielectric portion of the structural dielectric layer for exposing a central portion of the diaphragm and the back plate while an end portion of the diaphragm and the back plate are held by a residue portion of the structural dielectric layer, wherein the structural dielectric layer comprises a structural sacrificial dielectric layer, and the step of forming the structural dielectric layer comprises:

forming the structural sacrificial dielectric layer over the substrate, and wrapping at least one side of a diaphragm, wherein the structural sacrificial dielectric layer is larger in etching rate than the structural dielectric layer outside of the sacrificial layer.

17. The method of claim 16, wherein the step of forming the structural dielectric layer further comprise forming a top sacrificial dielectric layer over the diaphragm, wherein the top sacrificial dielectric layer is slower in etching rate than the structural dielectric layer outside of the sacrificial layer.

18. The method of claim 16, wherein the structural sacrificial dielectric layer is larger in etching rate than the structural dielectric layer outside of the sacrificial layer, and a part of the structure dielectric layer on the substrate under the structural sacrificial dielectric layer remains on the back plate facing the diaphragm after performing the isotropic etching process.

* * * * *